United States Patent
Shim

(10) Patent No.: US 10,964,734 B2
(45) Date of Patent: Mar. 30, 2021

(54) IMAGE SENSOR

(71) Applicant: Samsung Electronics Co., Ltd., Suwon-si (KR)

(72) Inventor: Eun Sub Shim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/564,143

(22) Filed: Sep. 9, 2019

(65) Prior Publication Data

US 2020/0235148 A1 Jul. 23, 2020

(30) Foreign Application Priority Data

Jan. 22, 2019 (KR) .................. 10-2019-0008159

(51) Int. Cl.
*H01L 27/146* (2006.01)

(52) U.S. Cl.
CPC .... *H01L 27/14605* (2013.01); *H01L 27/1463* (2013.01); *H01L 27/14607* (2013.01); *H01L 27/14621* (2013.01); *H01L 27/14627* (2013.01)

(58) Field of Classification Search
CPC ......... H01L 27/14605; H01L 27/14607; H01L 27/14621; H01L 27/14627; H01L 27/1463
USPC ........................................ 257/432
See application file for complete search history.

(56) References Cited

U.S. PATENT DOCUMENTS

| | | |
|---|---|---|
| 9,300,862 B2 | 3/2016 | Saito et al. |
| 10,014,338 B2 | 7/2018 | Lee |
| 2016/0269619 A1 | 9/2016 | Ui et al. |
| 2018/0006077 A1 | 1/2018 | Lee |
| 2018/0047766 A1* | 2/2018 | Pyo .................. H01L 27/14605 |
| 2018/0063456 A1 | 3/2018 | Lee |
| 2018/0158864 A1 | 6/2018 | Kim |

* cited by examiner

*Primary Examiner* — Tong-Ho Kim
(74) *Attorney, Agent, or Firm* — Muir Patent Law, PLLC

(57) ABSTRACT

Disclosed is an image sensor including a first device isolation layer in a semiconductor layer and defining a plurality of pixel regions, a first photoelectric conversion device and a second photoelectric conversion device that are in each of the pixel regions, and a second device isolation layer in the semiconductor layer vertically overlapping the first photoelectric conversion device and the second photoelectric conversion device.

19 Claims, 23 Drawing Sheets

IMAGE SENSOR

CROSS-REFERENCE TO RELATED APPLICATION

This U.S. nonprovisional application claims priority under 35 U.S.C § 119 to Korean Patent Application No. 10-2019-0008159 filed on Jan. 22, 2019 in the Korean Intellectual Property Office, the entire contents of which are hereby incorporated by reference.

BACKGROUND

The present inventive concepts relate to an image sensor, and more particularly, to an auto-focus image sensor.

To achieve an auto-focus function in digital image processing devices such as cameras, it may be necessary to detect focus adjustment states of imaging lenses. Conventional digital imaging processing apparatuses include a focus detecting device in addition to an image sensor and an additional lens for the focus detecting device to concentrate light thereon. Thus, it may be difficult to reduce costs and sizes of digital image processing devices. To overcome this difficulty, an auto-focus image sensor has been developed to accomplish an auto-focus function using a phase difference of incident light.

SUMMARY

Some example embodiments of the present inventive concepts provide an image sensor capable of achieving sharp image quality.

An object of the present inventive concepts is not limited to the mentioned above, and other objects which have not been mentioned above will be clearly understood to those skilled in the art from the following description.

According to some example embodiments of the present inventive concepts, an image sensor includes a first device isolation layer in a semiconductor layer and defining a plurality of pixel regions, a first photoelectric conversion device and a second photoelectric conversion device in each of the pixel regions, and a second device isolation layer in the semiconductor layer vertically overlapping the first photoelectric conversion device and the second photoelectric conversion device.

According to some example embodiments of the present inventive concepts, an image sensor includes a first device isolation layer in a semiconductor layer and defining a first pixel region and a second pixel region, the first device isolation layer and the second device isolation layer. The first device isolation layer includes a first isolation segment and a second isolation segment that are spaced apart from each other in a first direction and extend in a second direction different from the first direction, a third isolation segment that is parallel to the first direction and in contact with first ends of the first and second isolation segments, and a fourth isolation segment in contact with second ends of the first and second isolation segments, a first photoelectric conversion device and a second photoelectric conversion device that are in the first pixel region, and a second device isolation layer extending across the first pixel region at a first acute angle with respect to the first direction and contacting the first and second isolation segments. A first distance between the first end of the first isolation segment and a first end of the second device isolation layer is different from a second distance between the second end of the first isolation segment and a second end of the second device isolation layer. The first end of the second device isolation layer is in contact with the third isolation segment. A second end of the second device isolation layer is in contact with the fourth isolation segment.

According to an exemplary embodiment of the present inventive concept, an image sensor includes pixel regions in a substrate defined by a first device isolation layer, each pixel region including a first photoelectric conversion device and a second photoelectric conversion device that are spaced from each other in a first direction by a portion of the substrate, the portion of the substrate extending in a second direction different from the first direction, and second device isolation layers, each second device isolation layer being disposed in a corresponding one of the pixel regions. The second device isolation layers include a first type device isolation layer extending at a first acute angle with respect to the portion of the substrate.

DETAILED DESCRIPTION OF EMBODIMENTS

Figure 1:
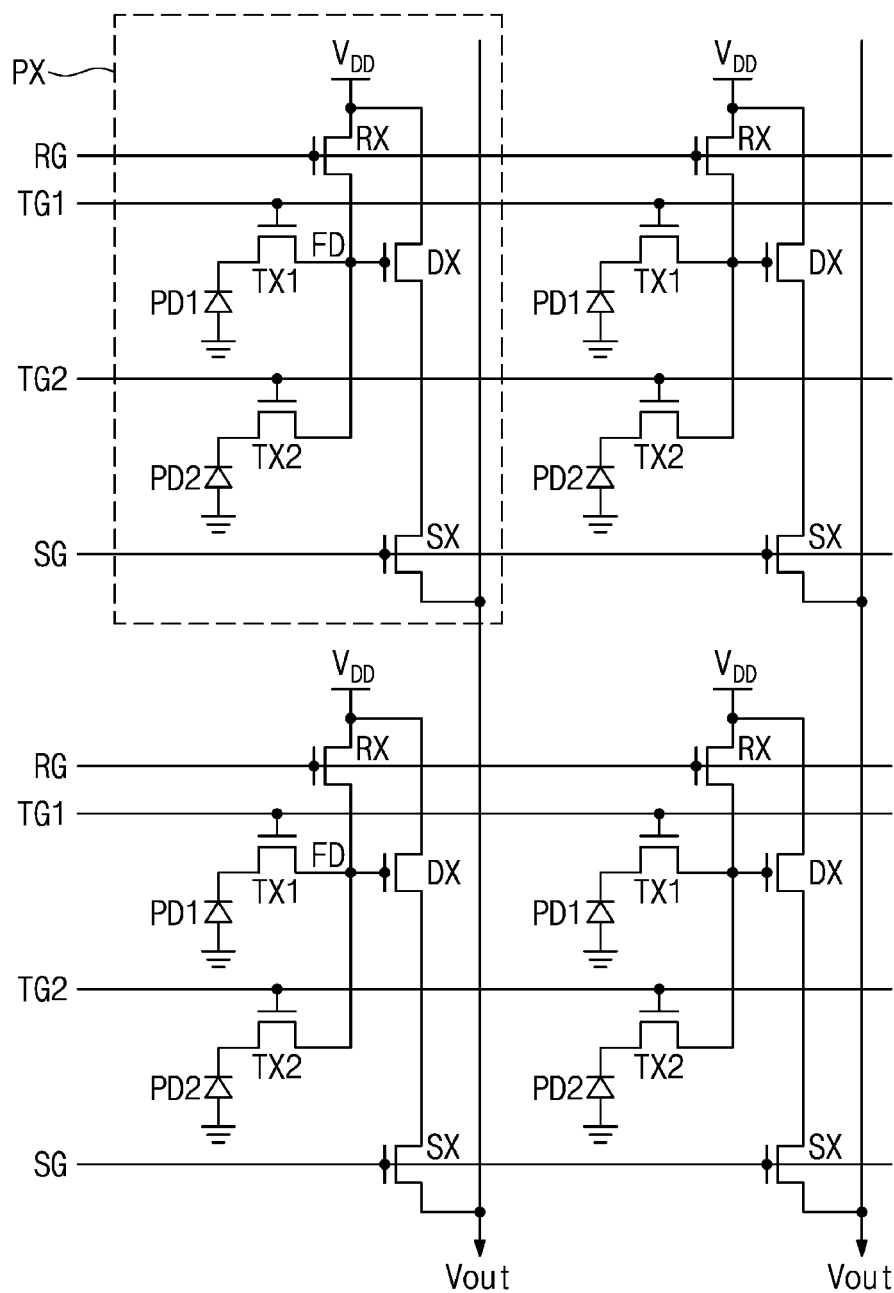
FIG. 1 illustrates a circuit diagram showing a pixel sensor array of an image sensor according to some example embodiments of the present inventive concepts.

FIG. 1 illustrates a circuit diagram showing a pixel sensor array of an image sensor according to some example embodiments of the present inventive concepts.

Referring to FIG. 1, an active pixel sensor array 1 may include a plurality of pixel regions PX. The pixel regions PX may be arranged in a matrix shape along row and column directions. Each of the pixel regions PX may include first and second photoelectric conversion devices PD1 and PD2, transfer transistors TX1 and TX2, and logic transistors RX, SX and DX. The logic transistors RX, SX and DX may include a reset transistor RX, a select transistor SX, and a drive transistor DX or a source follower transistor. Gate electrodes of the first transfer transistor TX1, the second transfer transistor TX2, the reset transistor RX, and the select transistor SX may be connected to a corresponding one of driving signal lines TG1, TG2, RG and SG. The driving signal lines TG1 and TG2 may be referred to hereinafter as a first transfer gate TG1 and a second transfer gate TG2.

The first transfer transistor TX1 may include the first transfer gate TG1 and the first photoelectric conversion device PD1, and the second transfer transistor TX2 may include the second transfer gate TG2 and the second photoelectric conversion device PD2. The first and second transfer transistors TX1 and TX2 may share a charge detect node FD or a floating diffusion region. The first and second photoelectric conversion devices PD1 and PD2 may generate and accumulate photo-charges in proportion to an amount of externally incident light. The first and second photoelectric conversion devices PD1 and PD2 may be or include one of a photo diode, a photo transistor, a photo gate, a pinned photo diode (PPD), and any combination thereof.

The first and second transfer gates TG1 and TG2 may transfer charges accumulated in the first and second photoelectric conversion devices PD1 and PD2 to the charge detect node FD (or the floating diffusion region). The first and second transfer gates TG1 and TG2 may receive complementary signals. For example, the charges may be transferred to the charge detect node FD from one of the first and second photoelectric conversion devices PD1 and PD2. The charge detect node FD may receive and accumulate the charges generated from one of the first and second photoelectric conversion devices PD1 and PD2. The drive transistor DX may be controlled by an amount of photo-charges accumulated in the charge detect node FD. The reset transistor RX may periodically reset the charges accumulated in the charge detect node FD. For example, the reset transistor RX may have a drain electrode connected to the charge detect node FD and a source electrode connected to a power voltage $V_{DD}$. When the reset transistor RX is turned on, the charge detect node FD may receive the power voltage $V_{DD}$ connected to the source electrode of the reset transistor RX. Accordingly, when the reset transistor RX is turned on, the charges accumulated in the charge detect node FD may be drained and then the charge detect node FD may be reset.

In conjunction with a static current source (not shown) located outside the pixel region PX, the drive transistor DX may serve as a source follower buffer amplifier, and may amplify a variation in electrical potential of the charge detect node FD and output the amplified electrical potential to an output line Vout. The select transistor SX may select each row of the pixel regions PX to generate a readout voltage. When the select transistor SX is turned on, electrical signals provided to a drain electrode of the select transistor SX may be transferred to a drain electrode of the select transistor SX.

Figure 2A:
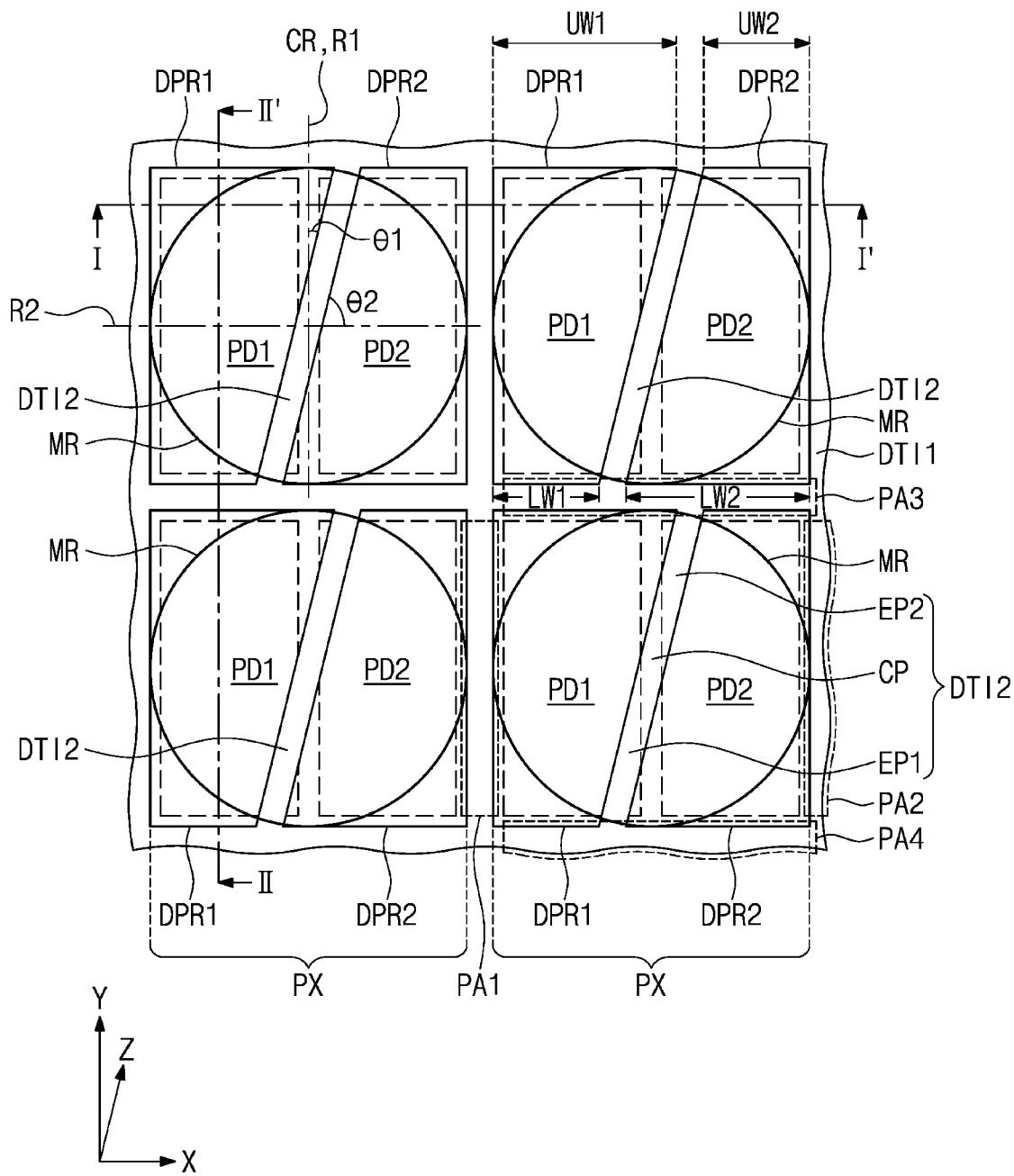
FIG. 2A illustrates a plan view showing an image sensor according to some example embodiments of the present inventive concepts.
Figure 2B:
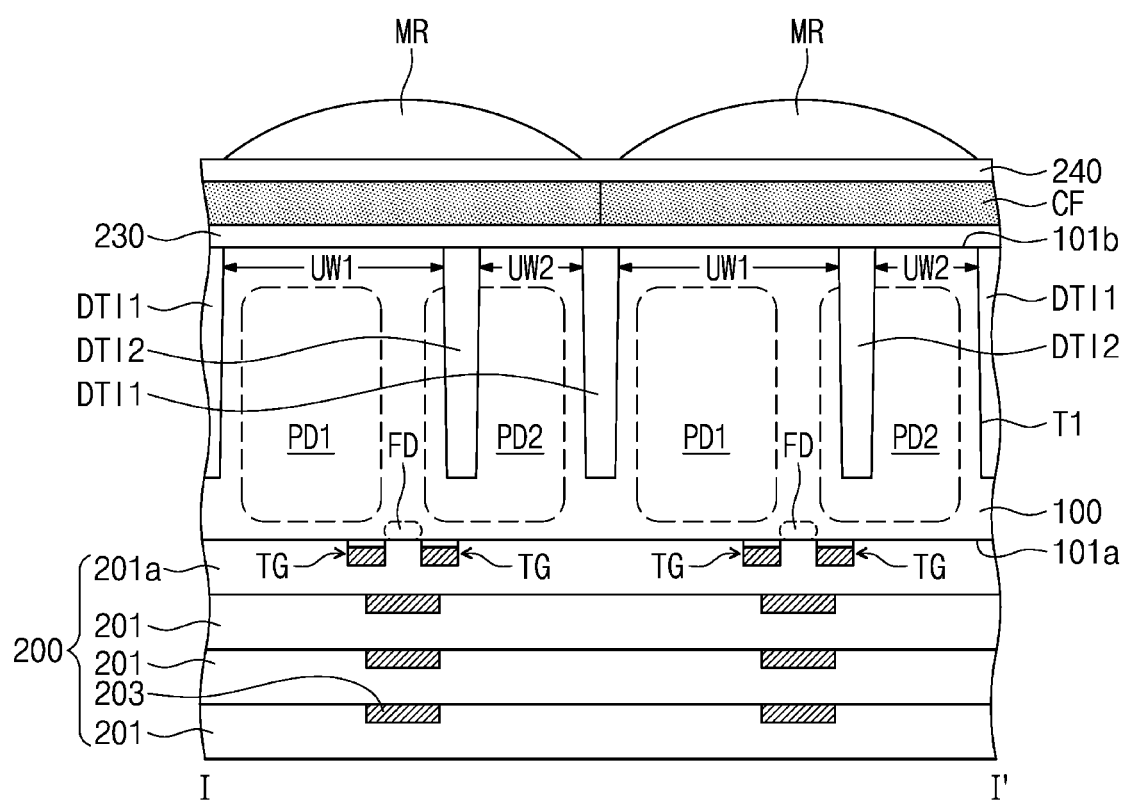
FIG. 2B illustrates a cross-sectional view taken along line I-I' of FIG. 2A, showing an image sensor according to some example embodiments of the present inventive concepts.
Figure 2C:
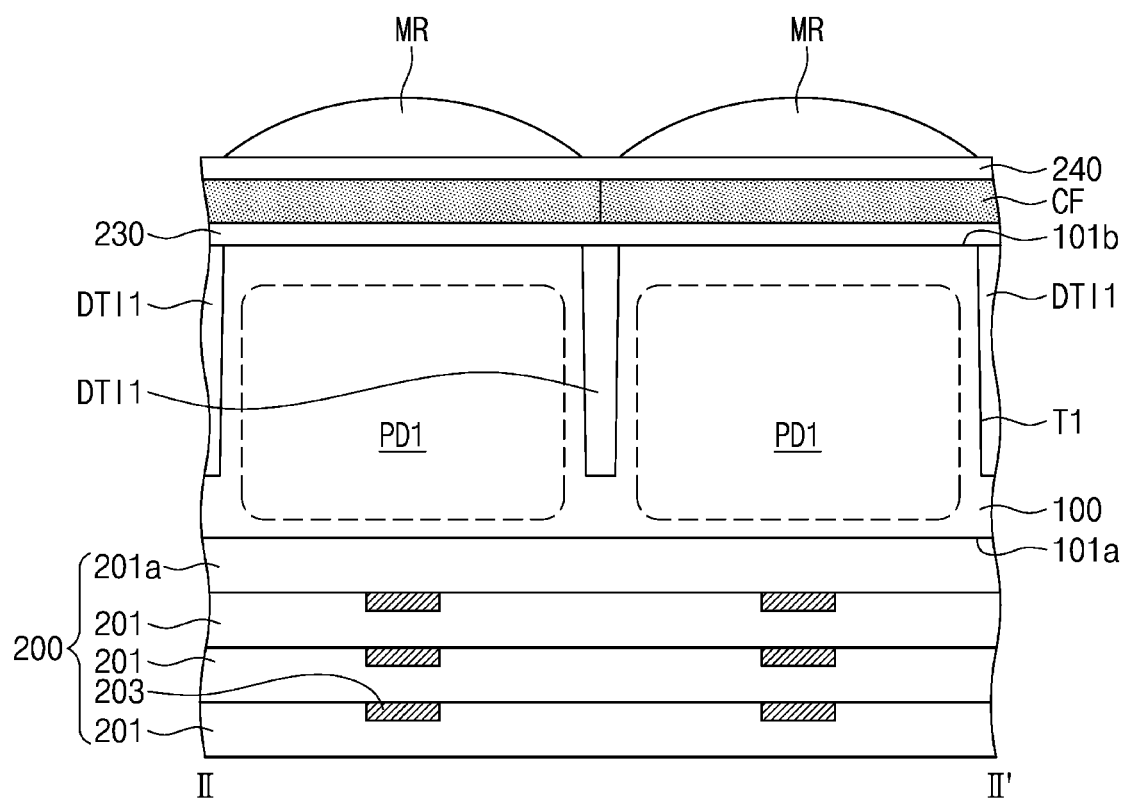
FIG. 2C illustrates a cross-sectional view taken along line II-II' of FIG. 2A, showing an image sensor according to some example embodiments of the present inventive concepts.

FIG. 2A illustrates a plan view showing an image sensor according to some example embodiments of the present inventive concepts. FIG. 2B illustrates a cross-sectional view taken along line I-I' of FIG. 2A, showing an image sensor according to some example embodiments of the present inventive concepts. FIG. 2C illustrates a cross-sectional view taken along line II-II' of FIG. 2A, showing an image sensor according to some example embodiments of the present inventive concepts.

Referring to FIGS. 2A, 2B, and 2C, an image sensor may include a semiconductor layer 100, first and second photoelectric conversion devices PD1 and PD2, a first device isolation layer DTI1, a second device isolation layer DTI2, a connection line structure 200, color filters CF, and micro-lenses MR. The semiconductor layer 100 may have a first surface 101a and a second surface 101b. The first and second surfaces 101a and 101b may face each other. The first surface 101a of the semiconductor layer 100 may be adjacent to the connection line structure 200, and the second surface 101b of the semiconductor layer 100 may be adjacent to the micro-lenses MR. The semiconductor layer 100 may be, for example, a silicon layer, a germanium layer, a silicon-germanium layer, a II-VI group compound semiconductor layer, a III-V group compound semiconductor layer, or a silicon-on-insulator (SOI) layer. The semiconductor layer 100 may include (i.e., may be doped with) p-type impurities.

The first device isolation layer DTI1 may be disposed in the semiconductor layer 100. The first device isolation layer DTI1 may define pixel regions PX. For example, each of the pixel regions PX may be surrounded by the first device isolation layer DTI1. The pixel regions PX may be spaced apart from each other in a first direction X and a second direction Y intersecting the first direction X. For example, the first direction X may be parallel to the first and second surfaces 101a and 101b of the semiconductor layer 100, and the second direction Y may be parallel to the first and second surfaces 101a and 101b of the semiconductor layer 100. The second direction Y may intersect perpendicularly to the first direction X. The first device isolation layer DTI1 may extend from the second surface 101b into the semiconductor layer 100. The first device isolation layer DTI1 may be spaced apart from the first surface 101a of the semiconductor layer 100. The first device isolation layer DTI1 may be disposed in a first trench T1 formed in the semiconductor layer 100. The first device isolation layer DTI1 may include, for example, one or more of a silicon oxide layer, a silicon nitride layer, and a dielectric layer such as $AlO_2$ or $HfO_2$.

The first photoelectric conversion device PD1 and the second photoelectric conversion device PD2 may be disposed on each of the pixel regions PX. On each of the pixel regions PX, the first and second photoelectric conversion devices PD1 and PD2 may be spaced apart from each other in the first direction X. The first and second photoelectric conversion devices PD1 and PD2 may individually receive incoming light from the second surface 101b of the semiconductor layer 100. The first and second photoelectric conversion devices PD1 and PD2 may include (i.e., may be doped with), for example, n-type impurities.

A charge detect node FD (or the floating diffusion region) may be disposed in the semiconductor layer 100. On each of the pixel regions PX, the charge detect node FD may be disposed between the first photoelectric conversion device PD1 and the second photoelectric conversion device PD2. The charge detect node FD may be adjacent to the first surface 101a of the semiconductor layer 100. The charge detect node FD may be connected in common to the first and second photoelectric conversion devices PD1 and PD2 on each of the pixel regions PX. The charge detect node FD may include (i.e., may be doped with), for example, n-type impurities.

The connection line structure 200 may be disposed on the first surface 101a of the semiconductor layer 100. The connection line structure 200 may include interlayer dielectric layers 201 and 201a, wiring lines 203, and transfer gates TG. The interlayer dielectric layers 201 and 201a may be sequentially stacked on the first surface 101a of the semiconductor layer 100. The interlayer dielectric layers 201 and 201a may include, for example, a silicon oxide layer or a silicon nitride layer. The wiring lines 203 may be disposed in the interlayer dielectric layers 201. The wiring lines 203 may include a metallic material, such as copper or tungsten. The transfer gates TG may be disposed on the first surface 101a of the semiconductor layer 100. Each of the transfer gates TG may be disposed to correspond to a corresponding one of the first and second photoelectric conversion devices PD1 and PD2 on each of the pixel regions PX. The transfer gates TG may be disposed in the lowermost interlayer dielectric layer 201a most adjacent to the first surface 101a of the semiconductor layer 100. On each of the pixel regions PX, the transfer gates TG on the semiconductor layer 100 may be spaced apart from each other across the charge detect node FD.

The micro-lenses MR may be disposed on the second surface 101b of the semiconductor layer 100. Each of the micro-lenses MR may be provided on a corresponding one of the pixel regions PX. The micro-lens MR may vertically overlap the first photoelectric conversion device PD1 and the second photoelectric conversion device PD2. For example, the first and second photoelectric conversion devices PD1 and PD2 on one pixel region PX may vertically overlap one micro-lens MR. In an example embodiment, the first photoelectric conversion device PD1 and the second photoelectric conversion device PD2 in each of the pixel regions PX may be separated or spaced apart from each other in the first direction X by a portion of the semiconductor layer 100 that is doped with impurities (e.g., p-type impurities) with opposite polarity with respect to the impurities of each of the first photoelectric conversion device PD1 and the second photoelectric conversion device PD2.

The second device isolation layer DTI2 may be disposed in the semiconductor layer 100 on each of the pixel regions PX. The second device isolation layer DTI2 may run across a corresponding one of the pixel regions PX. The second device isolation layer DTI2 may be connected to the first device isolation layer DTI1, while extending in a third direction Z intersecting the first and second directions X and Y. The third direction Z may be parallel to the first and second surfaces 101a and 101b of the semiconductor layer 100. The second device isolation layer DTI2 may be disposed in the semiconductor layer 100 between the first photoelectric conversion device PD1 and the second photoelectric conversion device PD2. The second device isolation layer DTI2 may also be disposed in the first photoelectric conversion device PD1 and the second photoelectric conversion device PD2. The second device isolation layer DTI2 may include the same material as that of the first device isolation layer DTI1. For example, the second device isolation layer DTI2 may include one or more of a silicon oxide layer, a silicon nitride layer, and a dielectric layer such as $AlO_2$ or $HfO_2$.

When viewed in plan, the second device isolation layer DTI2 may be tilted in the third direction Z. For example, when viewed in plan, the second device isolation layer DTI2 may be tilted at a first angle θ1 relative to (i.e., with respect to) a central line CR extending along a region between the first and second photoelectric conversion devices PD1 and PD2. The first angle θ1 may be, for example, greater than 0° and less than 90°. In an example embodiment, the first angle θ1 may be an acute angle close to 90°, for example, between 80° and 90°. In an example embodiment, the first angle θ1 may be greater than 45° and less than 90°. The central line CR may be parallel to the second direction Y. The second device isolation layer DTI2 may be tilted at the first angle θ1 relative to a first line R1 parallel to first parts PA1, PA2 of the first device isolation layer DTI1. The first parts PA1, PA2 may extend in the second direction Y. The first line R1 may be parallel to the second direction Y. The first line R1 may be coincident with the central line CR. The second device isolation layer DTI2 may be tilted at a second angle θ2 relative to a second line R2 parallel to second parts PA3, PA4 of the first device isolation layer DTI1. The second parts PA3, PA4 may extend in the first direction X. The second angle θ2 may be, for example, greater than 0° and less than 90°. For example, the second angle θ2 may be an acute angle. The second line R2 may be parallel to the first direction X. In certain embodiments, the first line R1 and the second line R2 may intersect perpendicularly to each other. A plurality of second device isolation layers DTI2 disposed on the pixel regions PX may be parallel to each other.

Each of the pixel regions PX may include a first region DPR1 and a second region DPR2 that are separated from each other by the second device isolation layer DTI2. The first photoelectric conversion device PD1 may be disposed on the first region DPR1, and the second photoelectric conversion device PD2 may be disposed on the second region DPR2. In certain embodiments, a portion of the second photoelectric conversion device PD2 may be disposed on the first region DPR1, and a portion of the first photoelectric conversion device PD1 may be disposed on the second region DPR2. The first region DPR1 may have an upper width UW1 greater than a lower width LW1 thereof (UW1>LW1). The second region DPR2 may have an upper width UW2 less than a lower width LW2 thereof (UW2<LW2). The upper width UW1 of the first region DPR1 may be greater than the upper width UW2 of the second region DPR2 (UW1>UW2). The lower width LW1 of the first region DPR1 may be less than the lower width LW2 of the second region DPR2 (LW1<LW2). When viewed in plan, each of the first and second regions DPR1 and DPR2 may have a trapezoidal shape.

When viewed in plan, the second device isolation layer DTI2 may vertically overlap one or more of the first photoelectric conversion device PD1 and the second photoelectric conversion device PD2. In an example embodiment, the second device isolation layer DTI2 may vertically overlap the first and second photoelectric conversion devices PD1 and PD2. The "vertically" may refer to a direction perpendicular to the first surface 101a of the semiconductor layer 100, for example. When viewed in plan, the second device isolation layer DTI2 may have a central segment CP between the first and second photoelectric conversion devices PD1 and PD2, a first edge segment EP1 vertically overlapping the first photoelectric conversion device PD1, and a second edge segment EP2 vertically overlapping the second photoelectric conversion device PD2. The second device isolation layer DTI2 may be disposed in one or more of the first and second photoelectric conversion devices PD1 and PD2. The second device isolation layer DTI2 may contact one or more of the first and second photoelectric conversion devices PD1 and PD2. In an example embodiment, the first edge segment EP1 of the second device isolation layer DTI2 may be disposed in the first photoelectric conversion device PD1, and the second edge segment EP2 of the second device isolation layer DTI2 may be disposed in the second photoelectric conversion device PD2. The first edge segment EP1 of the second device isolation layer DTI2 may contact the first photoelectric conversion device PD1, and the second edge segment EP2 of the second device isolation layer DTI2 may contact the second photoelectric conversion device PD2.

The first device isolation layer DTI1 may include a first isolation segment PA1, a second isolation segment PA2, a third isolation segment PA3, and a fourth isolation segment PA4. The first isolation segment PA1 and the second isolation segment PA2 may be extended in the second direction Y and be spaced apart from each other in the first direction X. The third isolation segment PA3 and the fourth isolation segment PA4 may extend in the first direction X and be spaced apart from each other in the second direction Y. In an example embodiment, the lower width LW1 of the first region DPR1 may correspond to a distance between a first end of the first edge segment EP1 of the second device isolation layer DTI2 and a first end of the first isolation segment PA1 of the first device isolation layer DTI1. The first end of the first edge segment EP1 may correspond to a lower, right corner of the first region DPR1. The first end of the first isolation segment PA1 may correspond to a lower, left corner of the first region DPR1. The first end of the first edge segment EP1 and the first end of the first isolation segment PA1 may be in contact with the fourth isolation segment PA4 of the first device isolation layer DTI1. For example, the upper width UW1 of the first region DPR1 may correspond to a distance between a second end of the second edge segment EP2 of the second device isolation layer DTI2 and a second end of the first isolation segment PA1 of the first device isolation layer DTI1. The second end of the second edge segment EP2 may correspond to an upper, right corner of the first region DPR1. The second end of the first isolation segment PA1 may correspond to an upper, left corner of the first region DPR1. The second end of the second edge segment EP2 and the second end of the first isolation segment PA1 may be in contact with the third isolation segment PA3 of the first device isolation layer DTI1. The term "contact" or "in contact with" refers to a direct connection, i.e., touching.

For example, the lower width LW2 of the second region DPR2 may correspond to a distance between a third end of the first edge segment EP1 of the second device isolation layer DTI2 and a third end of the second isolation segment PA2 of the first device isolation layer DTI1. The third end of the first edge segment EP1 may correspond to a lower, left corner of the second region DPR2. The third end of the second isolation segment PA2 may correspond to a lower, right corner of the second region DPR2. The third end of the first edge segment EP1 and the third end of the second isolation segment PA2 may be in contact with the fourth isolation segment PA4 of the first device isolation layer DTI1. For example, the upper width UW2 of the second region DPR2 may correspond to a distance between a fourth end of the second edge segment EP2 of the second device isolation layer DTI2 and a fourth end of the second isolation segment PA2 of the first device isolation layer DTI1. The fourth end of the second edge segment EP2 may correspond to an upper, left corner of the second region DPR2. The fourth end of the second isolation segment PA2 may correspond to an upper, right corner of the second region DPR2. The fourth end of the second edge segment EP2 and the fourth end of the second isolation segment PA2 may be in contact with the third isolation segment PA3 of the first device isolation layer DTI1.

In an example embodiment, the image sensor may have an auto-focus function. The auto-focus image sensor may achieve a phase-difference auto-focus by using a difference in data recognized by the first and second photoelectric conversion devices PD1 and PD2 that receive light incident in a right-side direction (e.g., the first direction X) and a left-side direction (e.g., a direction opposite to the first direction X), respectively, when viewed in plan. For example, the sensor may achieve the auto-focus function by detecting phase difference between two split incoming lights. In an example embodiment, the detecting of the phase difference may include dividing (or splitting) an incoming light into two incoming lights using the second device isolation layer DIT2 and comparing phases of the two incoming lights detected using the first and second photoelectric conversion devices PD1 and PD2 separated from each other in each of the pixels PX. According to some example embodiments of the present inventive concepts, when viewed in plan, because the second device isolation layer DTI2 is formed tilted between the first photoelectric conversion device PD1 and the second photoelectric conversion device PD2, one of the first and second photoelectric conversion devices PD1 and PD2 may receive light incident in an upper direction (e.g., the second direction D2) and the other of the first and second photoelectric conversion devices PD1 and PD2 may receive light incident in a lower direction (e.g., a direction opposite to the second direction Y). In an example embodiment, the image sensor may include the second device isolation layer DTI2 tilted in various angles to increase the auto-focus sensitivity. Accordingly, the auto-focus sensitivity of the image sensor may increase due to an increase in detection capability for images in horizontal and vertical directions. In an example embodiment, the first region DPR1 may include an upper side with a first upper width (e.g., UW1) and the second region DPR2 may include an upper side with a second upper width (e.g., UW2) different from the first upper width. In this case, the upper side of the first region DPR1 and the upper side of the second region DPR2 may be in contact with the third isolation segment PA3 of the first device isolation layer DTI1.

The color filters CF may be disposed between the micro-lenses MR and the second surface 101b of the semiconductor layer 100. The color filters CF may correspond to the pixel regions PX. For example, one color filter CR may vertically overlap the first and second photoelectric conversion devices PD1 and PD2 disposed on one pixel region PX. The color filters CF may include green filters, blue filters, and red filters. The color filters CF may be arranged in a Bayer pattern. The Bayer pattern may indicate a color filter array in which half of the total filters are green filters for green light which is the most sensitive to human eyes.

A first dielectric layer 230 may be disposed between the color filters CF and the second surface 101b of the semiconductor layer 100. The first dielectric layer 230 may cover the second surface 101b of the semiconductor layer 100. For example, the first dielectric layer 230 may serve as an anti-reflection layer. The first dielectric layer 230 may include, for example, one or more of a silicon oxide layer, a silicon nitride layer, a silicon oxynitride layer, and a hafnium oxide layer. A planarization layer 240 may be disposed between the color filters CF and the micro-lenses MR. The planarization layer 240 may cover top surfaces of the color filters CF. In an example embodiment, the planarization layer 240 may include a silicon oxide layer, a silicon oxynitride layer, or a silicon nitride layer. In an example embodiment, the planarization layer 240 may include an organic layer.

Figure 3:
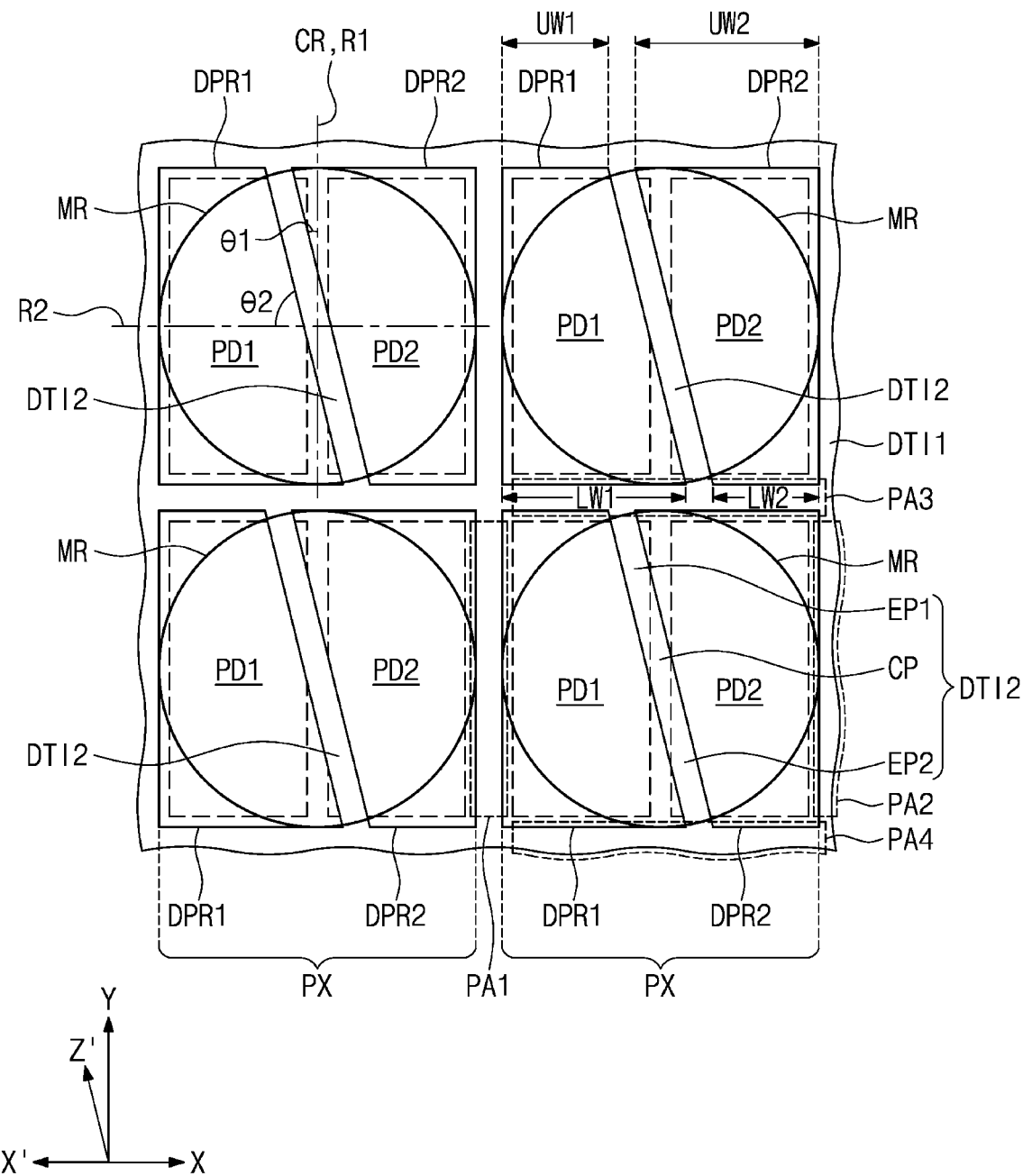
FIG. 3 illustrates a plan view showing an image sensor according to some example embodiments of the present inventive concepts.

FIG. 3 illustrates a plan view showing an image sensor according to some example embodiments of the present inventive concepts.

Referring to FIG. 3, when viewed in plan, the second device isolation layer DTI2 may be tilted in a fifth direction Z' intersecting a fourth direction X' and the second direction Y. The fourth direction X' and the fifth direction Z' may be parallel to the first and second surfaces 101a and 101b of the semiconductor layer 100. The fourth direction X' may be a direction tilted at an angle of 180° relative to the first direction X. For example, the fourth direction X' may be opposite to the first direction X, and the second direction Y may be perpendicular to the fourth direction X'. When viewed in plan, the second device isolation layer DTI2 may be tilted at a first angle θ1 relative to the central line CR extending along a region between the first and second photoelectric conversion devices PD1 and PD2. The first angle θ1 may be, for example, greater than 0° and less than 90°. For example, the first angle θ1 may be an acute angle. The second device isolation layer DTI2 may be tilted at the first angle θ1 relative to the first line R1. The first line R1 may be parallel to the first parts PA1, PA2 of the first device isolation layer DTI1. The first parts PA1, PA2 may be parallel to the second direction Y. The first line R1 may be coincident with the central line CR. The second device isolation layer DTI2 may be tilted at a second angle θ2 relative to the second line R2. The second angle θ2 may be, for example, greater than 0° and less than 90°. For example, the second angle θ2 may be an acute angle. The second line R2 may be parallel to the second parts PA3, PA4 of the first device isolation layer DTI1. The second parts PA3, PA4 may be parallel to the first direction X. For example, the first line R1 and the second line R2 may intersect perpendicularly to each other.

In certain embodiments, the first region DPR1 may have an upper width UW1 less than a lower width LW1 thereof (UW1<LW1). The second region DPR2 may have an upper width UW2 greater than a lower width LW2 thereof (UW2>LW2). The upper width UW1 of the first region DPR1 may be less than the upper width UW2 of the second region DPR2 (UW1<UW2). The lower width LW1 of the first region DPR1 may be greater than the lower width LW2 of the second region DPR2 (LW1>LW2).

For example, the upper width UW1 of the first region DPR1 may correspond to a minimum distance between the first edge segment EP1 of the second device isolation layer DTI2 and the first isolation segment PA1 of the first device isolation layer DTI1. For example, the lower width LW1 of the first region DPR1 may correspond to a maximum distance between the second edge segment EP2 of the second device isolation layer DTI2 and the first isolation segment PA1 of the first device isolation layer DTI1. For example, the upper width UW2 of the second region DPR2 may correspond to a maximum distance between the first edge segment EP1 of the second device isolation layer DTI2 and the second isolation segment PA2 of the first device isolation layer DTI1. For example, the lower width LW2 of the second region DPR2 may correspond to a minimum distance between the second edge segment EP2 of the second device isolation layer DTI2 and the second isolation segment PA2 of the first device isolation layer DTI1.

Figure 4:
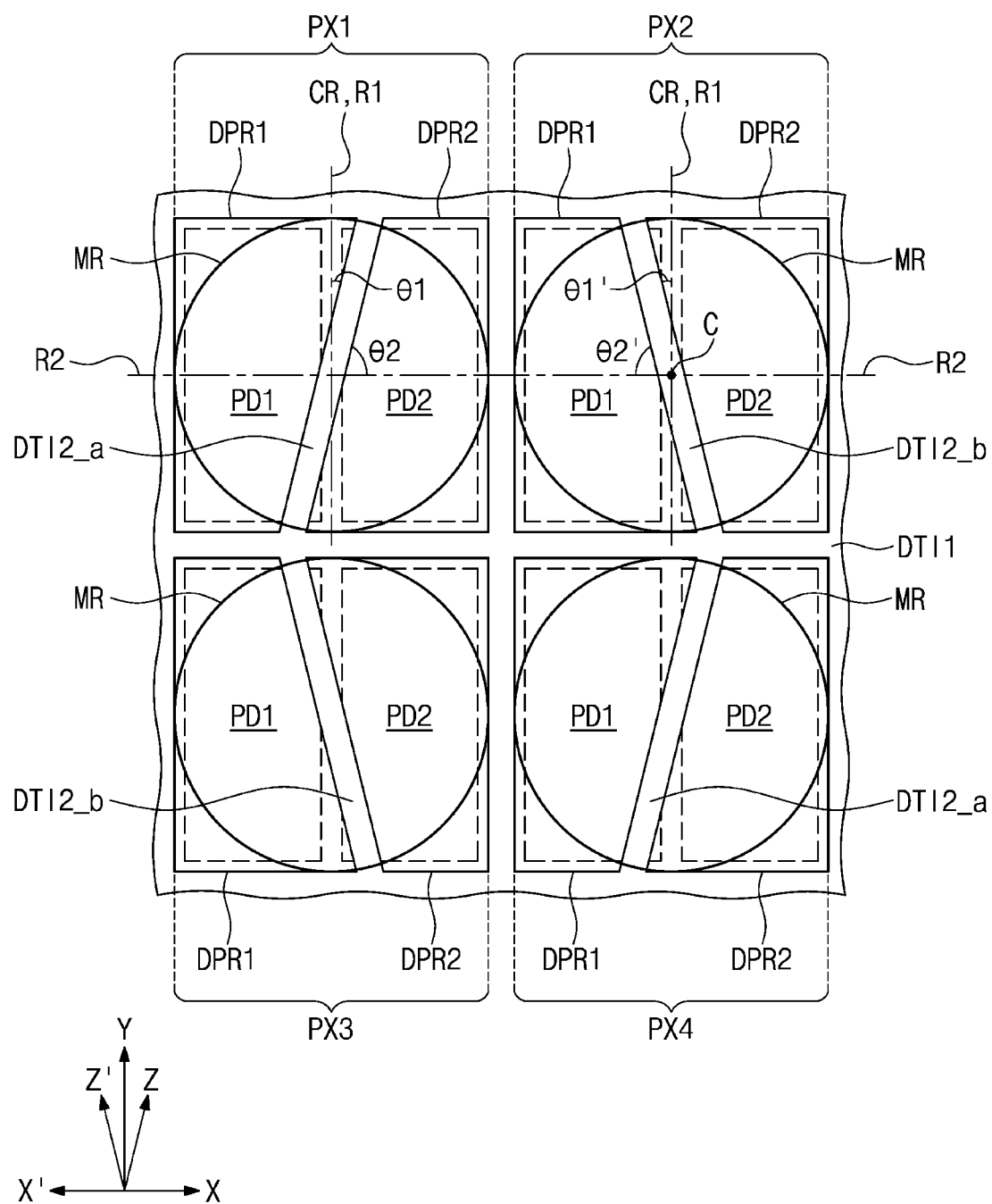
FIG. 4 illustrates a plan view showing an image sensor according to some example embodiments of the present inventive concepts.

FIG. 4 illustrates a plan view showing an image sensor according to some example embodiments of the present inventive concepts.

Referring to FIG. 4, the first device isolation layer DTI1 may define first, second, third, and fourth pixel regions PX1, PX2, PX3, and PX4, for example. The first pixel region PX1 and the second pixel region PX2 may face each other in the first direction X. The third pixel region PX3 and the fourth pixel region PX4 may face each other in the first direction X. The first pixel region PX1 and the third pixel region PX3 may face each other in the second direction Y, and the second pixel region PX2 and the fourth pixel region PX4 may face each other in the second direction Y. When viewed in plan, each of the first and fourth pixel regions PX1 and PX4 may be provided therein with a second device isolation layer DTI2_a tilted in the third direction Z. Each of the second and third pixel regions PX2 and PX3 may be provided therein with a second device isolation layer DTI2_b tilted in the fifth direction Z'. The second device isolation layer DTI2_a and the second device isolation layer DTI2_b may not be parallel to each other.

When viewed in plan, the second device isolation layer DTI2_a, which may be referred to as a first type device isolation layer, disposed on each of the first and fourth pixel regions PX1 and PX4 may be tilted at a first angle θ1 relative to the central line CR or the first line R1, and the second device isolation layer DTI2_b, which may be referred to as a second type device isolation layer, disposed on each of the second and third pixel regions PX2 and PX3 may be tilted at another first angle θ1' relative to the central line CR or the first line R1. For example, the first angle θ1 and another first angle θ1' may be substantially the same. The second device isolation layer DTI2_a disposed on each of the first and fourth pixel regions PX1 and PX4 may be tilted at a second angle θ2 relative to the second line R2, and the second device isolation layer DTI2_b disposed on each of the second and third pixel regions PX2 and PX3 may be tilted at another second angle θ2' relative to the second line R2. For example, the second angle θ2 and another second angle θ2' may be substantially the same. In an example embodiment, the first and second type device isolation layer may have different acute angles with respect to the second direction Y such as the first angles θ1 and θ1'. The present inventive concept is not limited thereto. In an example embodiment, the second device isolation layer may further include three or more device isolation layers having different acute angles with respect to the second direction Y, for example. In an example embodiment, the device isolation layers having different acute angles with respect to the second direction Y may be variously arranged in the image sensor. With reference to FIGS. 5, 6, 7A, 10A, 10B, 11, 12A, 13, such example arrangements of a second device isolation layer will be described.

Figure 5:
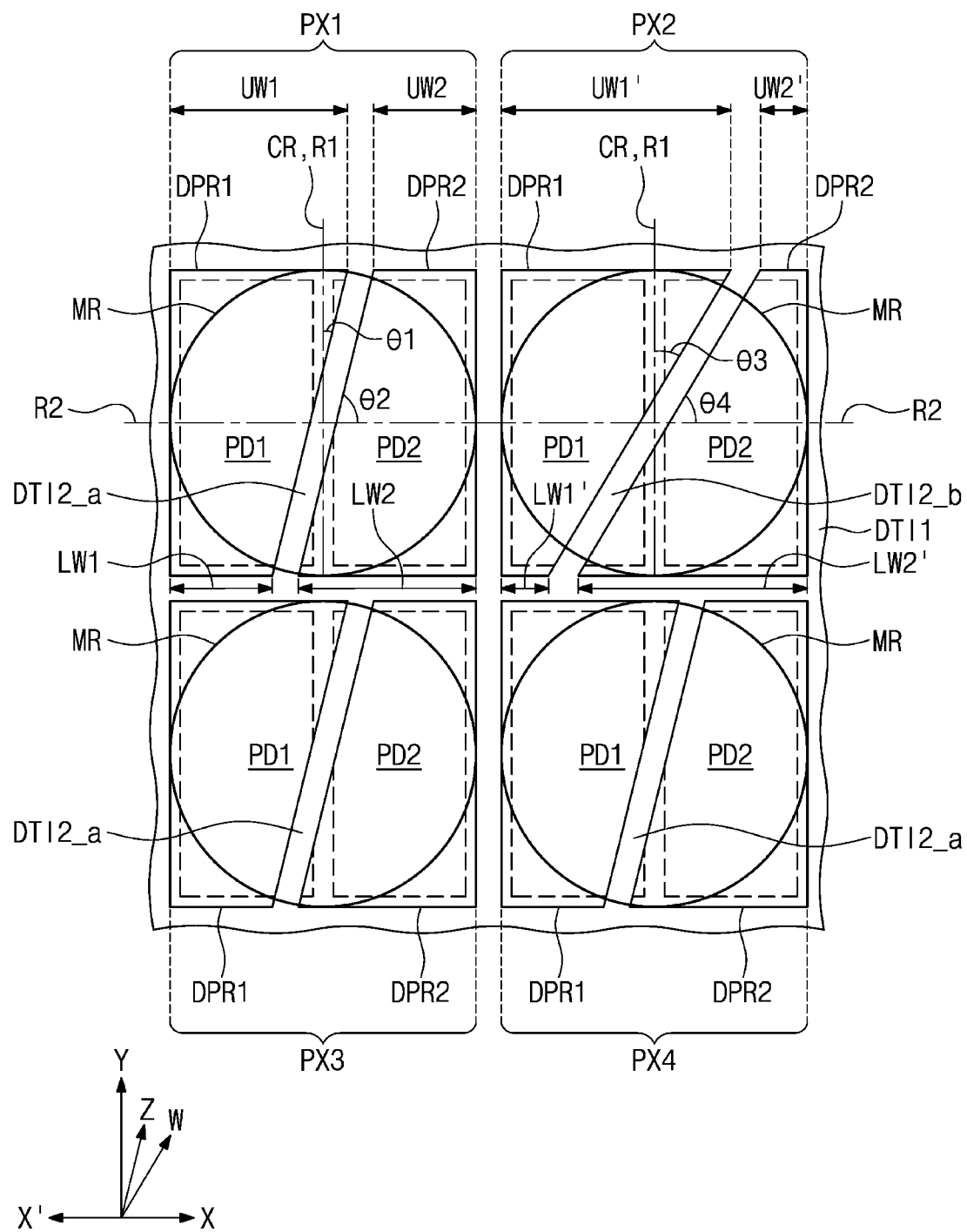
FIG. 5 illustrates a plan view showing an image sensor according to some example embodiments of the present inventive concepts.

FIG. 5 illustrates a plan view showing an image sensor according to some example embodiments of the present inventive concepts.

Referring to FIG. 5, when viewed in plan, the second pixel region PX2 may be provided therein with a second device isolation layer DTI2_b tilted in a sixth direction W intersecting the first and second directions X and Y, and each of the first, third, and fourth pixel regions PX1, PX3, and PX4 may be provided therein with a second device isolation layer DTI2_a tilted in the third direction Z intersecting the first and second directions X and Y. The sixth direction W may be parallel to the first and second surfaces 101a and 101b of the semiconductor layer 100. The third direction Z and the sixth direction W may be tilted at different angles relative to the first direction X.

When viewed in plan, the second device isolation layer DTI2_b disposed on the second pixel region PX2 may be tilted at an angle different from that of the second device isolation layer DTI2_a disposed on each of the first, third, and fourth pixel regions PX1, PX3, and PX4. For example, the second device isolation layer DTI2_a disposed on each of the first, third, and fourth pixel regions PX1, PX3, and PX4 may be tilted at a first angle θ1 relative to the central line CR or the first line R1. The second device isolation layer DTI2_b disposed on the second pixel region PX2 may be tilted at a third angle θ3 relative to the central line CR or the first line R1. The first angle θ1 and the third angle θ3 may be different from each other. For example, the first angle θ1 may be less than the third angle θ3 (θ1<θ0). The second device isolation layer DTI2_a disposed on each of the first, third, and fourth pixel regions PX1, PX3, and PX4 may be tilted at a second angle θ2 relative to the second line R2. The second device isolation layer DTI2_b disposed on the second pixel region PX2 may be tilted at a fourth angle θ4 relative to the second line R2. The second angle θ2 and the fourth angle θ4 may be different from each other. For example, the second angle θ2 may be greater than the fourth angle θ4 (θ2>θ4).

In certain embodiments, the first region DPR1 of each of the first, third, and fourth pixel regions PX1, PX3, and PX4 may have an upper width UW1 less than an upper width UW1' of the first region DPR1 of the second pixel region PX2 (UW1<UW1'). The first region DPR1 of each of the first, third, and fourth pixel regions PX1, PX3, and PX4 may have a lower width LW1 greater than a lower width LW1' of the first region DPR1 of the second pixel region PX2 (LW1>LW1'). The second region DPR2 of each of the first, third, and fourth pixel regions PX1, PX3, and PX4 may have an upper width UW2 greater than an upper width UW2' of the second region DPR2 of the second pixel region PX2 (UW2>UW2'). The second region DPR2 of each of the first, third, and fourth pixel regions PX1, PX3, and PX4 may have a lower width LW2 less than a lower width LW2' of the second region DPR2 of the second pixel region PX2 (LW2<LW2').

Figure 6:
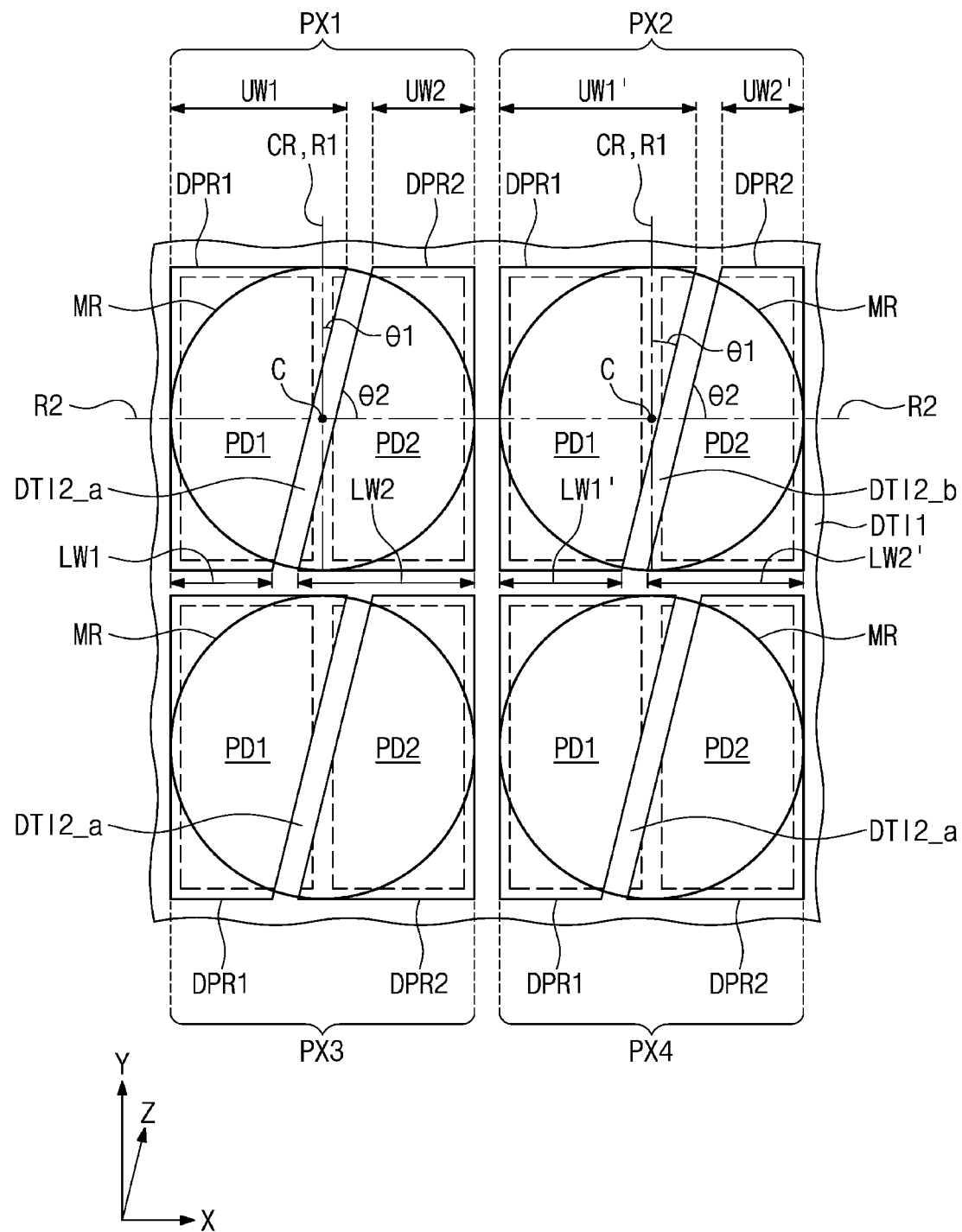
FIG. 6 illustrates a plan view showing an image sensor according to some example embodiments of the present inventive concepts.

FIG. 6 illustrates a plan view showing an image sensor according to some example embodiments of the present inventive concepts.

Referring to FIG. 6, the second pixel region PX2 may be provided therein with a second device isolation layer DTI2_b tilted at substantially the same angle as that of a second device isolation layer DTI2_a disposed on each of the first, third, and fourth pixel regions PX1, PX3, and PX4. For example, the second device isolation layers DTI2_a and DTI2_b may be tilted at a first angle θ1 relative to central line CR or the first line R1. For example, the second device isolation layers DTI2_a and DTI2_b may be tilted at a second angle θ2 relative to the second line R2.

In certain embodiments, the first region DPR1 of each of the first, third, and fourth pixel regions PX1, PX3, and PX4 may have an upper width UW1 less than an upper width UW1' of the first region DPR1 of the second pixel region PX2 (UW1<UW1'). The first region DPR1 of each of the first, third, and fourth pixel regions PX1, PX3, and PX4 may have a lower width LW1 less than a lower width LW1' of the first region DPR1 of the second pixel region PX2 (LW1<LW1'). The second region DPR2 of each of the first, third, and fourth pixel regions PX1, PX3, and PX4 may have an upper width UW2 greater than an upper width UW2' of the second region DPR2 of the second pixel region PX2 (UW2>UW2'). The second region DPR2 of each of the first, third, and fourth pixel regions PX1, PX3, and PX4 may have a lower width LW2 greater than a lower width LW2' of the second region DPR2 of the second pixel region PX2 (LW2>LW2').

The second device isolation layers DTI2_a disposed on the first, third, and fourth pixel regions PX1, PX3, and PX4 may vertically overlap centers C of the micro-lenses MR corresponding to the first, third, and fourth pixel regions PX1, PX3, and PX4. The second device isolation layer DTI2_b disposed on the second pixel region PX2 may not vertically overlap a center C of the micro-lens corresponding to the second pixel region PX2. For example, the second device isolation layer DTI2_b disposed on the second pixel region PX2 may be shifted in the first direction X from the center C of the micro-lens corresponding to the second pixel region PX2.

Figure 7A:
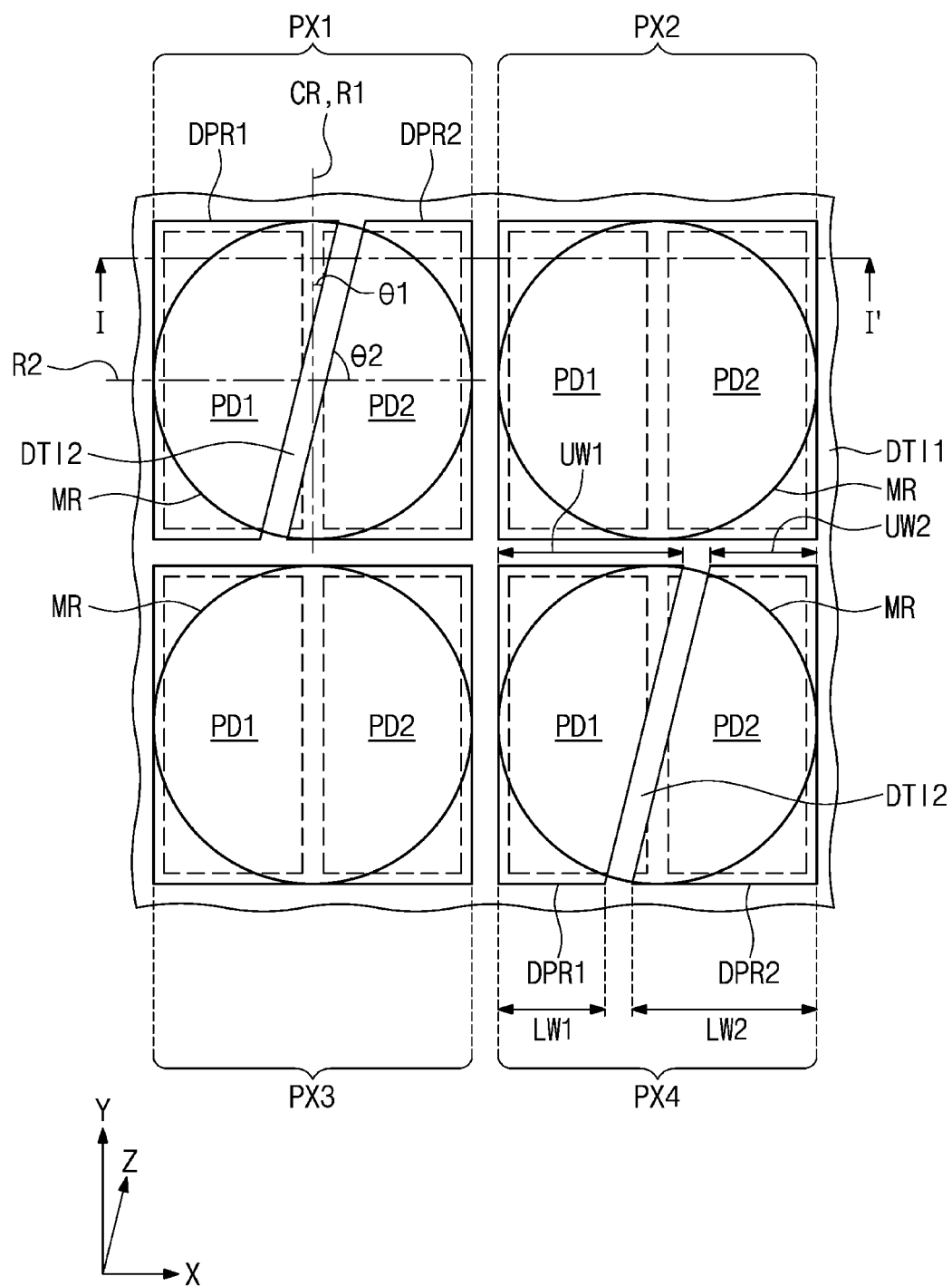
FIG. 7A illustrates a plan view showing an image sensor according to some example embodiments of the present inventive concepts.
Figure 7B:
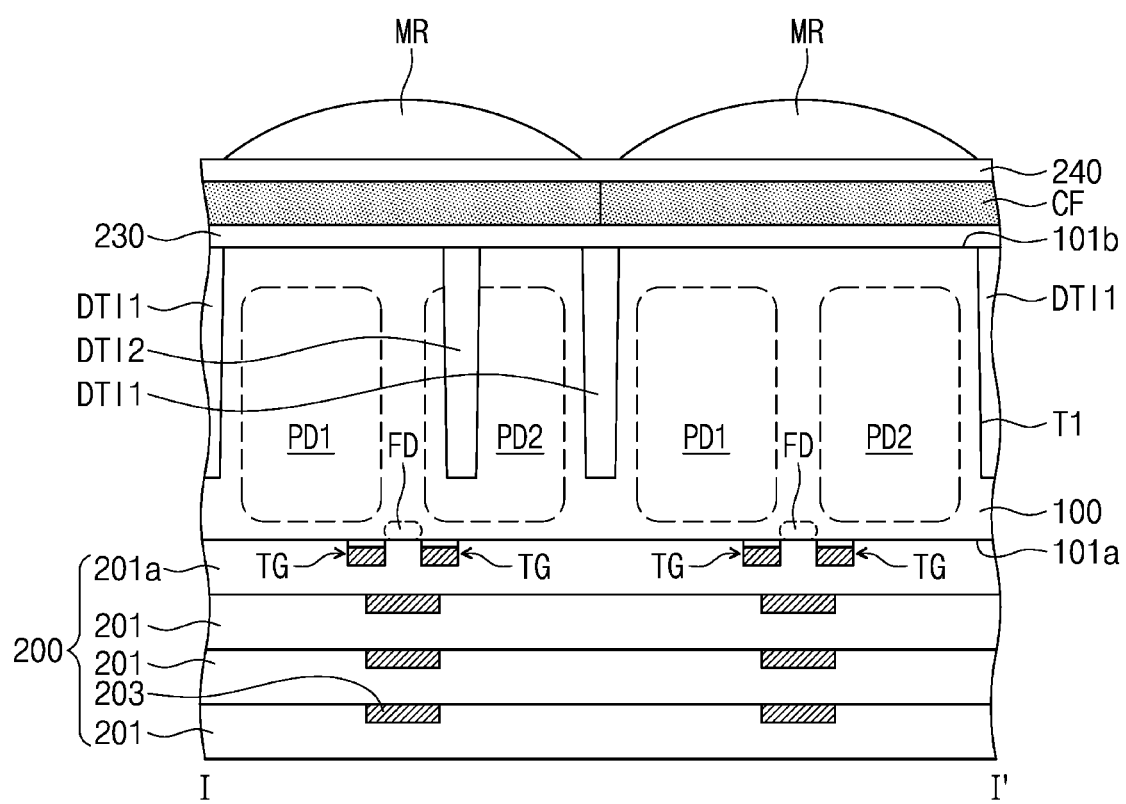
FIG. 7B illustrates a cross-sectional view taken along line I-I' of FIG. 7A, showing an image sensor according to some example embodiments of the present inventive concepts.

FIG. 7A illustrates a plan view showing an image sensor according to some example embodiments of the present inventive concepts. FIG. 7B illustrates a cross-sectional view taken along line I-I' of FIG. 7A, showing an image sensor according to some example embodiments of the present inventive concepts.

Referring to FIGS. 7A and 7B, the second device isolation layer DTI2 may be disposed in the semiconductor layer 100 on each of the first and fourth pixel regions PX1 and PX4. The second device isolation layer DTI2 may not run across each of the second and third pixel regions PX2 and PX3. For example, no layer may be provided in the semiconductor layer 100 between the first and second photoelectric conversion devices PD1 and PD2 on each of the second and third pixel regions PX2 and PX3.

Figure 8A:
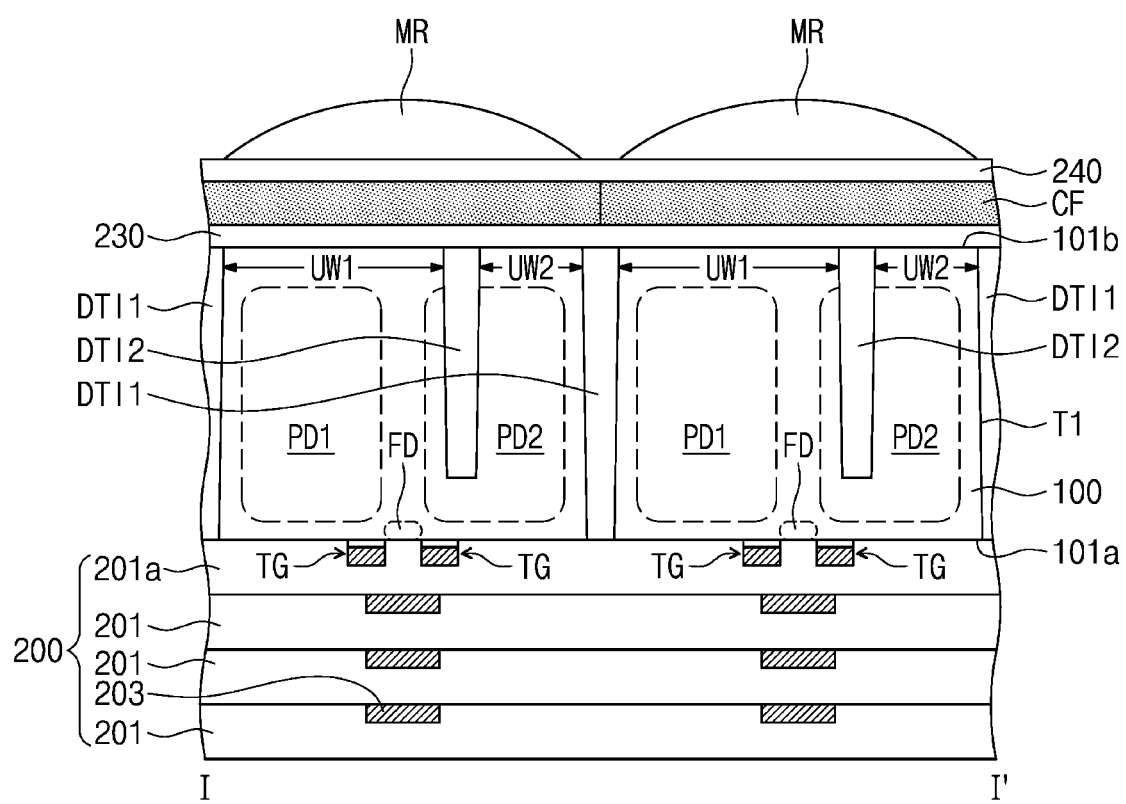
FIG. 8A illustrates a cross-sectional view taken along line I-I' of FIG. 2A, showing an image sensor according to some example embodiments of the present inventive concepts.
Figure 8B:
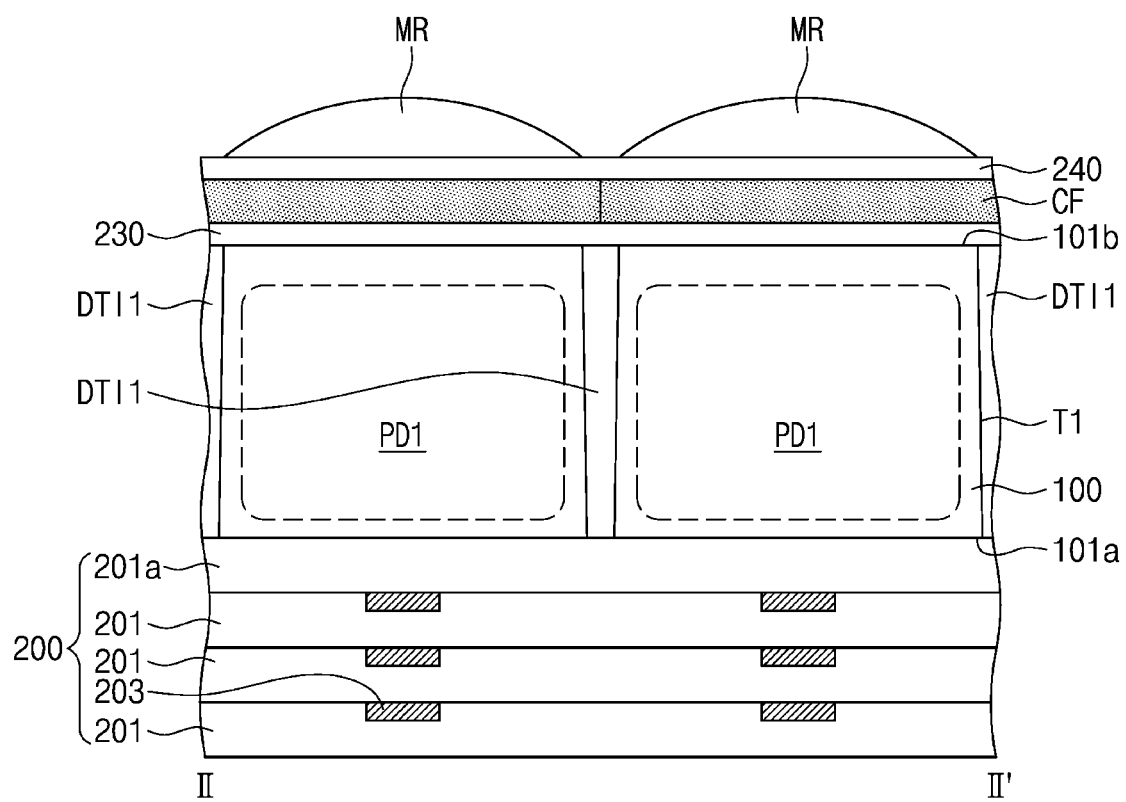
FIG. 8B illustrates a cross-sectional view taken along line II-II' of FIG. 2A, showing an image sensor according to some example embodiments of the present inventive concepts.

FIG. 8A illustrates a cross-sectional view taken along line I-I' of FIG. 2A, showing an image sensor according to some example embodiments of the present inventive concepts. FIG. 8B illustrates a cross-sectional view taken along line II-II' of FIG. 2A, showing an image sensor according to some example embodiments of the present inventive concepts.

Referring to FIGS. 8A and 8B, the first device isolation layer DTI1 may be in contact with the first surface 101a of the semiconductor layer 100, and the second device isolation layer DTI2 may be spaced apart from the first surface 101a of the semiconductor layer 100.

Figure 9A:
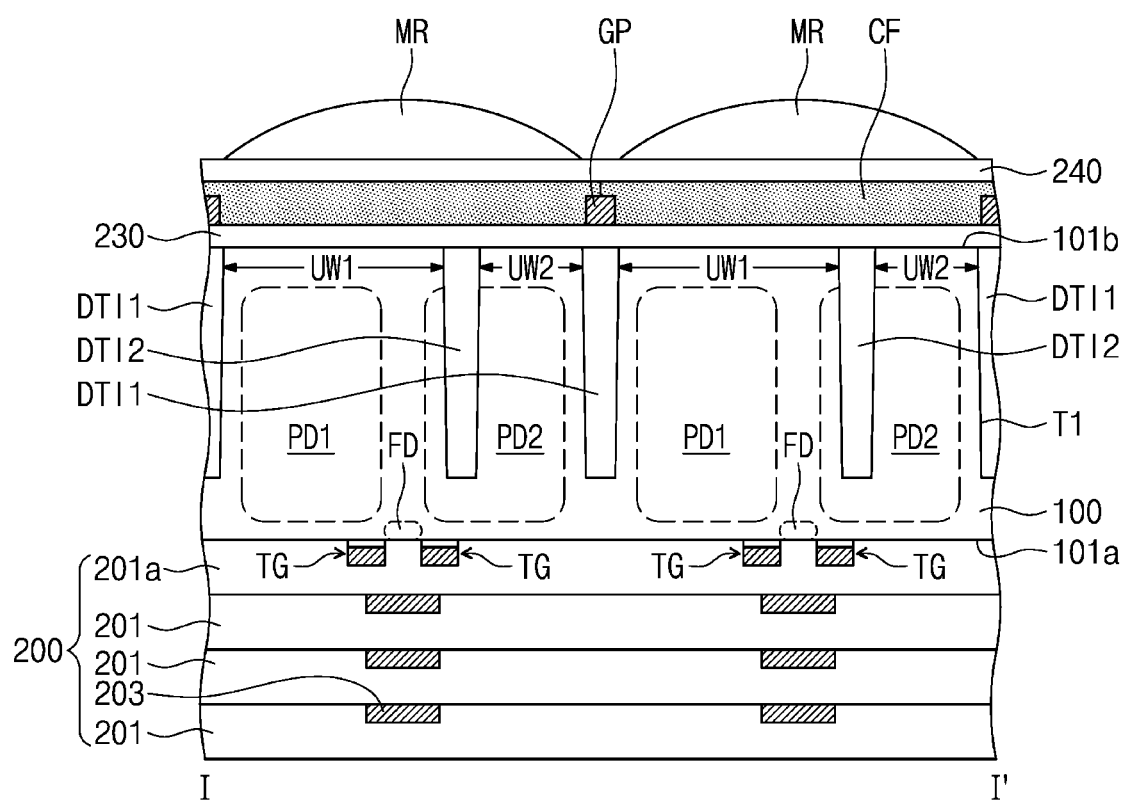
FIG. 9A illustrates a cross-sectional view taken along line I-I' of FIG. 2A, showing an image sensor according to some example embodiments of the present inventive concepts.
Figure 9B:
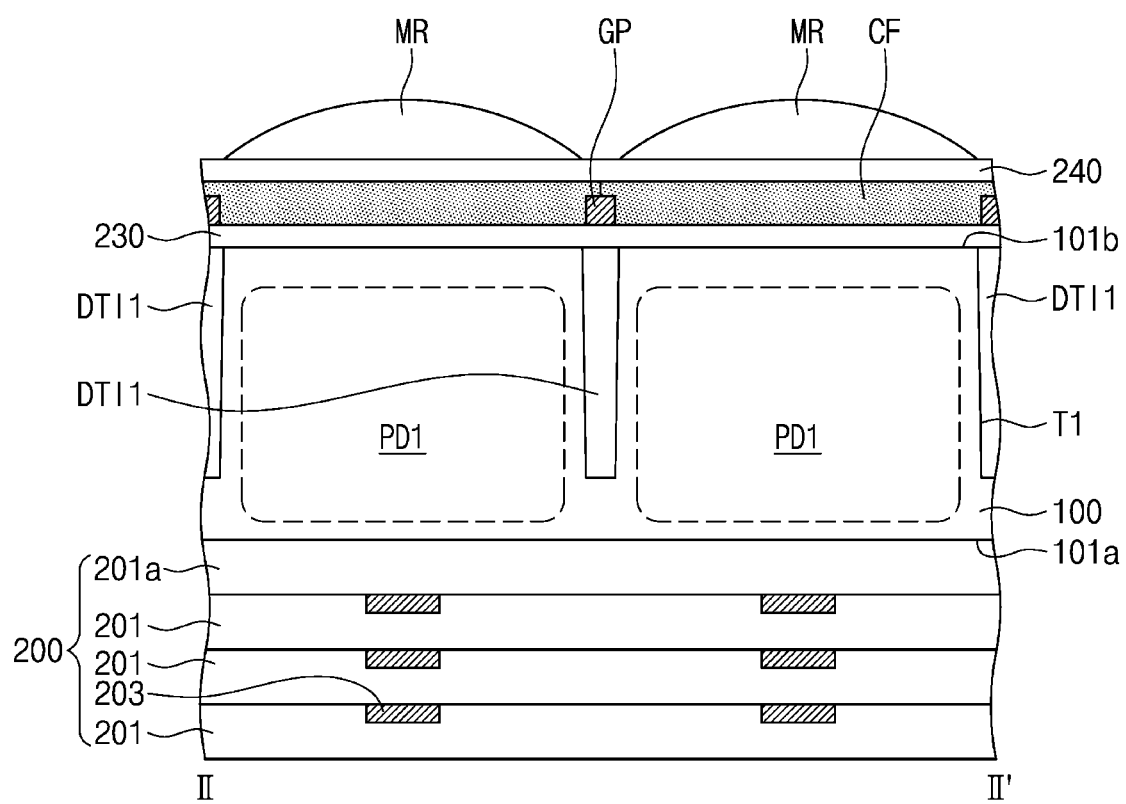
FIG. 9B illustrates a cross-sectional view taken along line II-II' of FIG. 2A, showing an image sensor according to some example embodiments of the present inventive concepts.

FIG. 9A illustrates a cross-sectional view taken along line I-I' of FIG. 2A, showing an image sensor according to some example embodiments of the present inventive concepts. FIG. 9B illustrates a cross-sectional view taken along line II-II' of FIG. 2A, showing an image sensor according to some example embodiments of the present inventive concepts.

Referring to FIGS. 9A and 9B, a grid pattern GP may be disposed on the first dielectric layer 230. The grid pattern GP may extend along the first device isolation layer DTI1. The grid pattern GP may be covered with the color filters CF. The grid pattern GP may include a metallic material, such as tungsten. The first device isolation layer DTI1 and the second device isolation layer DTI2 may be spaced apart from the first surface 101a of the semiconductor layer 100. The grid pattern GP may guide light that is incident obliquely on the second surface 101b of the substrate 100 to a corresponding each first, second, third, and fourth pixels PX1, PX2, PX3, and PX4. In other words, the obliquely incident light may be reflected by the grid pattern GP into the first and the second photoelectric conversion elements PD1, PD2 of the corresponding each first, second, third, and fourth pixels PX1, PX2, PX3, and PX4.

Figure 10A:
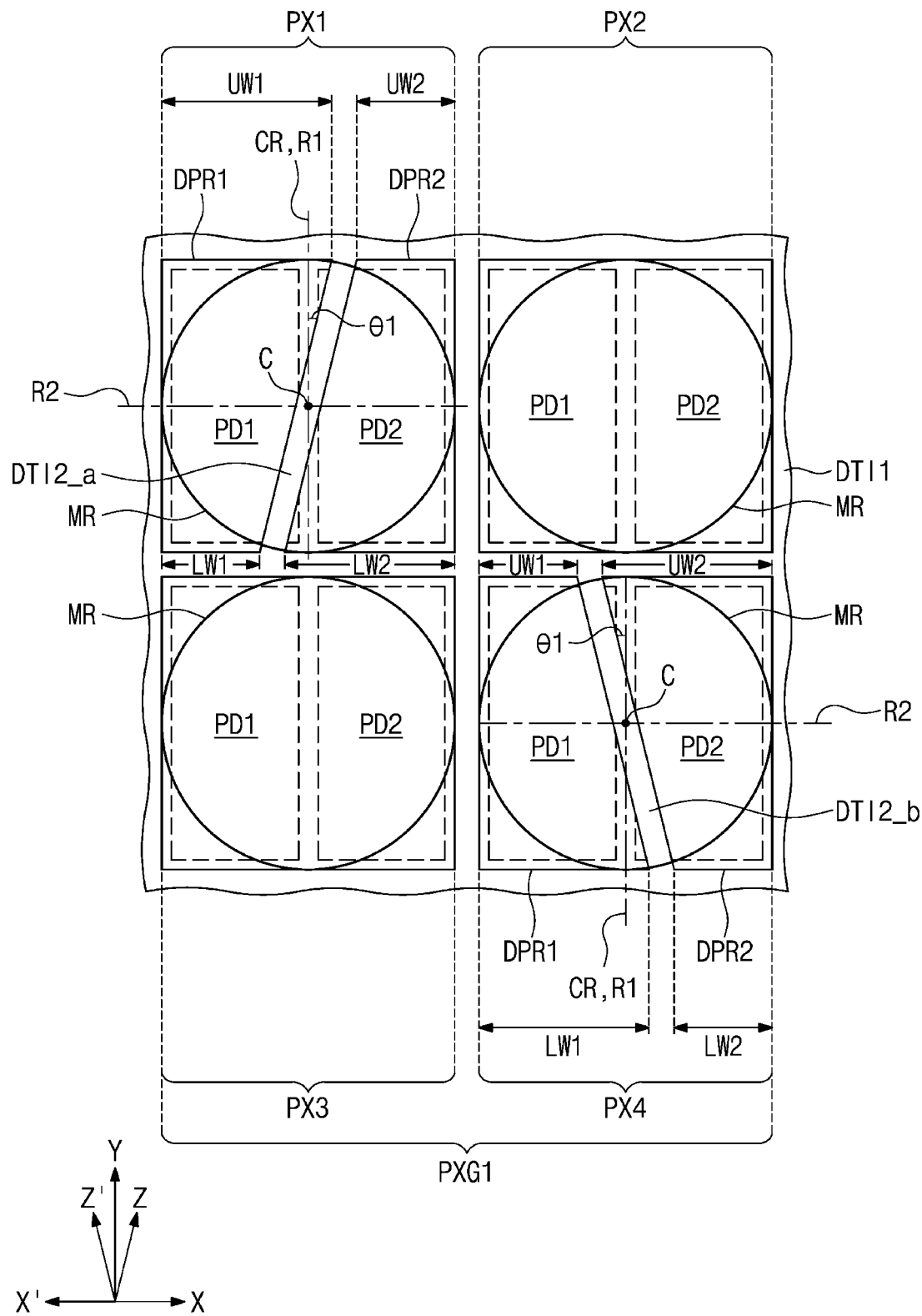
FIGS. 10A and 10B illustrate plan views showing an image sensor according to some example embodiments of the present inventive concepts.
Figure 10B:
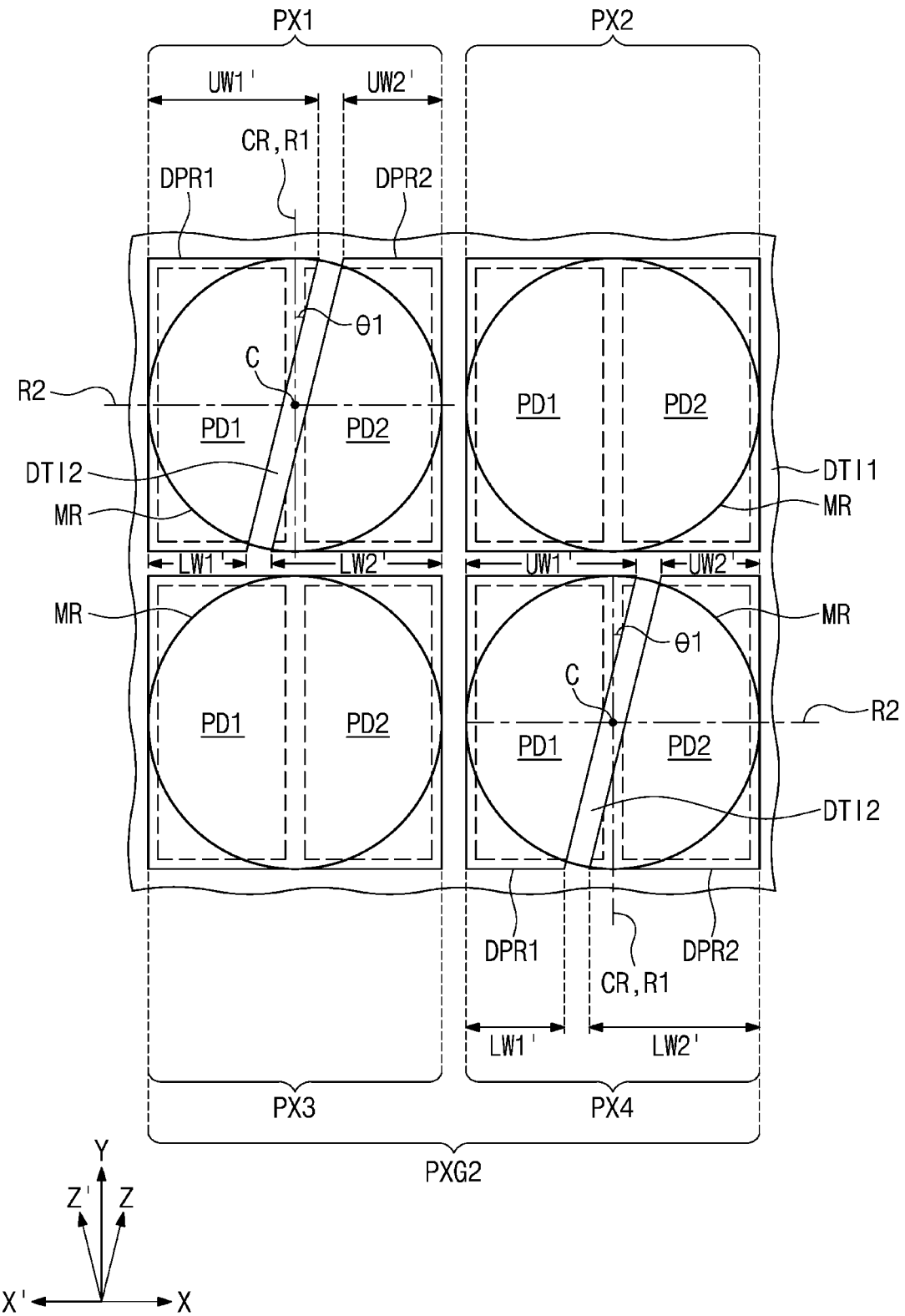

FIGS. 10A and 10B illustrate plan views showing an image sensor according to some example embodiments of the present inventive concepts.

Referring to FIGS. 10A and 10B, an image sensor may include a first pixel group PXG1 and a second pixel group PXG2. Each of the first and second pixel groups PXG1 and PXG2 may include the first, second, third, and fourth pixel regions PX1, PX2, PX3, and PX4. The first pixel region PX1 and the second pixel region PX2 may be spaced apart from each other in the first direction X, and the third pixel region PX3 and the fourth pixel region PX4 may be spaced apart from each other in the first direction X. The first pixel region PX1 and the third pixel region PX3 may be spaced apart from each other in the second direction Y, and the second pixel region PX2 and the fourth pixel region PX4 may be spaced apart from each other in the second direction Y.

The first pixel group PXG1 may be provided thereon with second device isolation layers DTI2_a and DTI2_b. The second device isolation layer DTI2_a may be disposed on the first pixel region PX1, and the second device isolation layer DTI2_b may be disposed on the fourth pixel region PX4. The second device isolation layer DTI2_a on the first pixel region PX1 may be tilted at a first angle θ1 relative to the central line CR or the first line R1. The first angle θ1 may be, for example, greater than 0° and less than 90°. The second device isolation layer DTI2_a on the first pixel region PX1 may extend in the third direction Z intersecting the first and second directions X and Y. The first region DPR1 of the first pixel region PX1 may have an upper width UW1 greater than an upper width UW2 of the second region DPR2 of the first pixel region PX1 (UW1>UW2). The first region DPR1 of the first pixel region PX1 may have a lower width LW1 less than a lower width LW2 of the second region DPR2 of the first pixel region PX1 (LW1<LW2). The upper width UW1 of the first region DPR1 of the first pixel region PX1 may be greater than the lower width LW1 of the first region DPR1 of the first pixel region PX1 (UW1>LW1). The upper width UW2 of the second region DPR2 of the first pixel region PX1 may be less than the lower width LW2 of the second region DPR2 of the first pixel region PX1 (UW2<LW2).

The second device isolation layer DTI2_b on the fourth pixel region PX4 may be tilted at a first angle θ1 relative to the central line CR or the first line R1. The first angle θ1 may be, for example, greater than 0° and less than 90°. The second device isolation layer DTI2_b on the fourth pixel region PX4 may extend in the fifth direction Z' intersecting the second direction Y and the fourth direction X' that is opposite to the first direction X. The first region DPR1 of the fourth pixel region PX4 may have an upper width UW1 less than an upper width UW2 of the second region DPR2 of the fourth pixel region PX4 (UW1<UW2). The first region DPR1 of the fourth pixel region PX4 may have a lower width LW1 greater than a lower width LW2 of the second region DPR2 of the fourth pixel region PX4 (LW1>LW2). The upper width UW1 of the first region DPR1 of the fourth pixel region PX4 may be less than the lower width LW1 of the first region DPR1 of the fourth pixel region PX4 (UW1<LW1). The upper width UW2 of the second region DPR2 of the fourth pixel region PX4 may be greater than the lower width LW2 of the second region DPR2 of the fourth pixel region PX4 (UW2>LW2). The upper width UW1 of the first region DPR1 of the first pixel region PX1 may be greater than the upper width UW1 of the first region DPR1 of the fourth pixel region PX4. The upper width UW2 of the second region DPR2 of the first pixel region PX1 may be less than the upper width UW2 of the second region DPR2 of the fourth pixel region PX4. The lower width LW1 of the first region DPR1 of the first pixel region PX1 may be less than the lower width LW1 of the first region DPR1 of the fourth pixel region PX4. The lower width LW2 of the second region DPR2 of the first pixel region PX1 may be greater than the lower width LW2 of the second region DPR2 of the fourth pixel region PX4.

On the first pixel group PXG1, the second device isolation layers DTI2_a and DTI2_b may not be provided on the second and third pixel regions PX2 and PX3.

The second pixel group PXG2 may be provided thereon with second device isolation layers DTI2. The second device isolation layers DTI2 may be disposed on the first and fourth pixel regions PX1 and PX4. The second device isolation layer DTI2 may be tilted at a first angle θ1 relative to the first line R1 or the central line CR. The first angle θ1 may be, for example, greater than 0° and less than 90°. The second device isolation layer DTI2 may extend in the third direction Z intersecting the first and second directions X and Y. The first region DPR1 of each of the first and fourth pixel regions PX1 and PX4 may have an upper width UW1' greater than an upper width UW2' of the second region DPR2 of each of the first and fourth pixel region PX1 and PX4 (UW1'>UW2'). The first region DPR1 of each of the first and fourth pixel regions PX1 and PX4 may have a lower width LW1' less than a lower width LW2' of the second region DPR2 of each of the first and fourth pixel regions PX1 and PX4 (LW1'<LW2'). The upper width UW1' of the first region DPR1 of each of the first and fourth pixel regions PX1 and PX4 may be greater than the lower width LW1' of the first region DPR1 of each of the first and fourth pixel regions PX1 and PX4 (UW1'>LW1'). The upper width UW2' of the second region DPR2 of each of the first and fourth pixel regions PX1 and PX4 may be less than the lower width LW2' of the second region DPR2 of each of the first and fourth pixel regions PX1 and PX4 (UW2'<LW2').

The upper width UW1' of the first region DPR1 of the first pixel region PX1 may be the same as the upper width UW1' of the first region DPR1 of the fourth pixel region PX4. The upper width UW2' of the second region DPR2 of the first pixel region PX1 may be the same as the upper width UW2' of the second region DPR2 of the fourth pixel region PX4. The lower width LW1' of the first region DPR1 of the first pixel region PX1 may be the same as the lower width LW1' of the first region DPR1 of the fourth pixel region PX4. The lower width LW2' of the second region DPR2 of the first pixel region PX1 may be the same as the lower width LW2' of the second region DPR2 of the fourth pixel region PX4.

On the second pixel group PXG2, the second device isolation layers DTI2 may not be provided on the second and third pixel regions PX2 and PX3.

Figure 11A:
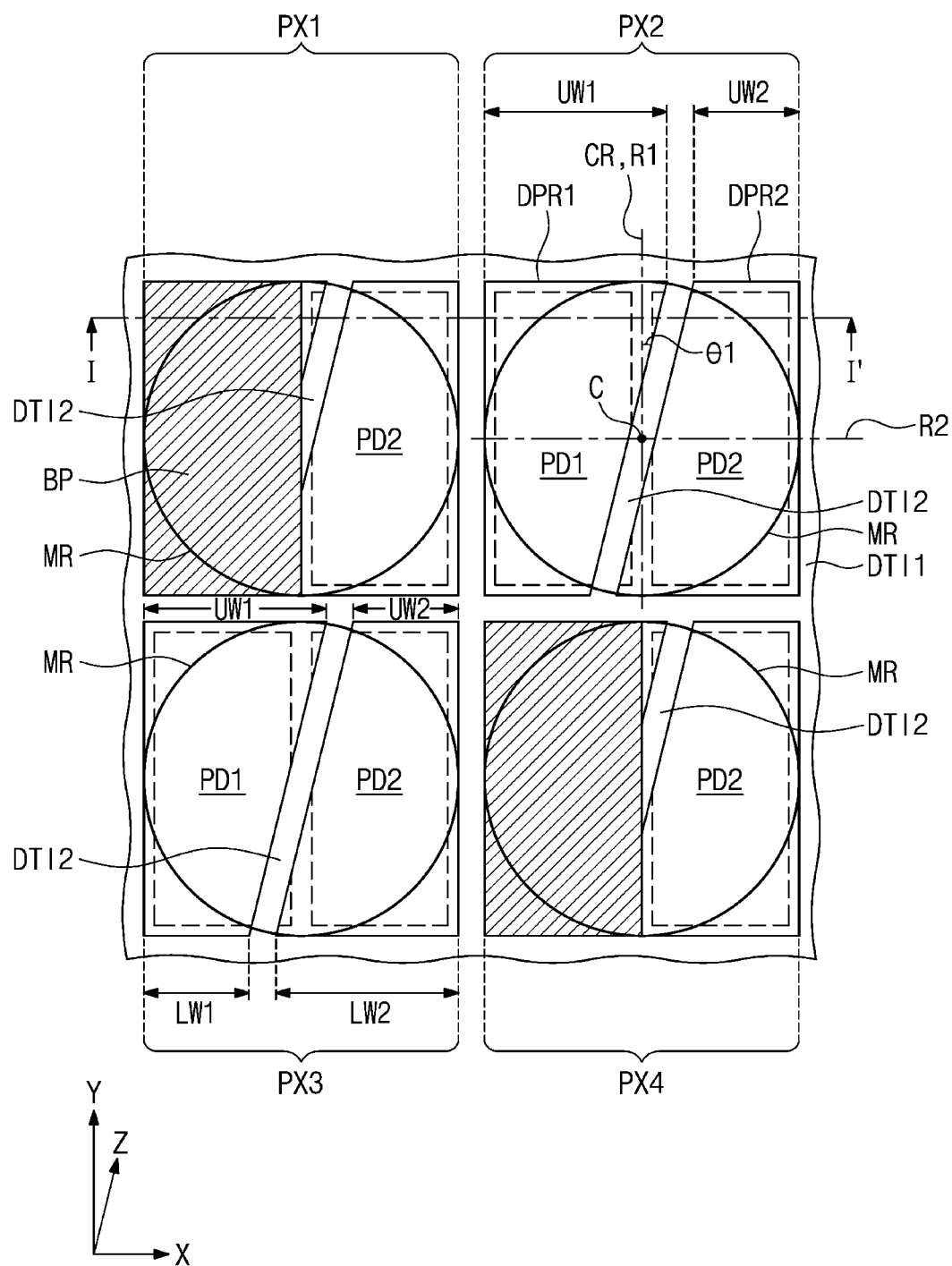
FIG. 11A illustrates a plan view showing an image sensor according to some example embodiments of the present inventive concepts.
Figure 11B:
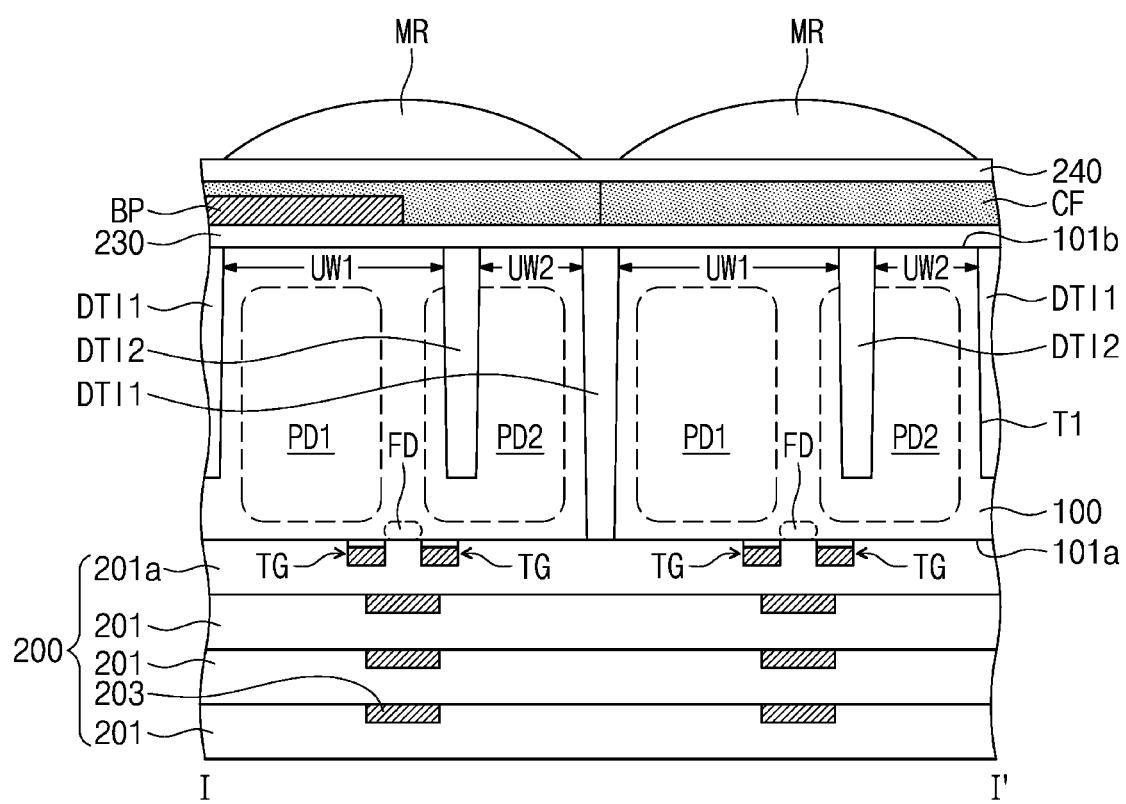
FIG. 11B illustrates a cross-sectional view taken along line I-I' of FIG. 11A, showing an image sensor according to some example embodiments of the present inventive concepts.

FIG. 11A illustrates a plan view showing an image sensor according to some example embodiments of the present inventive concepts. FIG. 11B illustrates a cross-sectional view taken along line I-I' of FIG. 11A, showing an image sensor according to some example embodiments of the present inventive concepts.

Referring to FIGS. 11A and 11B, light-shield patterns BP may be disposed on the first dielectric layer 230. The light-shield patterns BP may be disposed on the first photoelectric conversion devices PD1 of the first and fourth pixel regions PX1 and PX4. When viewed in plan, the light-shield patterns BP may cover the first photoelectric conversion devices PD1 of the first and fourth pixel regions PX1 and PX4. When viewed in plan, the light-shield patterns BP may expose the second photoelectric conversion devices PD2 of the first and fourth pixel regions PX1 and PX4. The light-shield patterns BP may include a metallic material, such as tungsten.

Figure 12A:
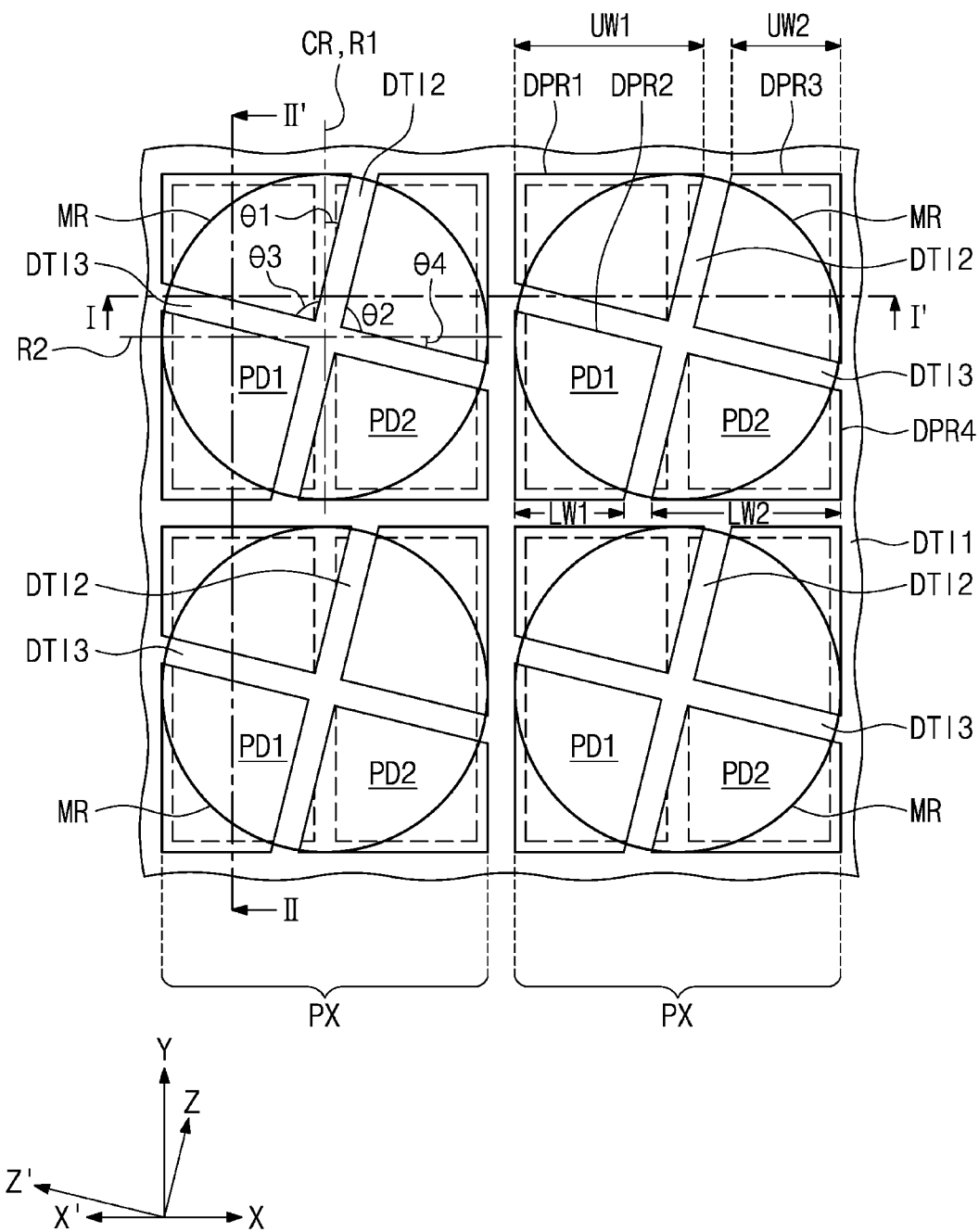
FIG. 12A illustrates a plan view showing an image sensor according to some example embodiments of the present inventive concepts.
Figure 12B:
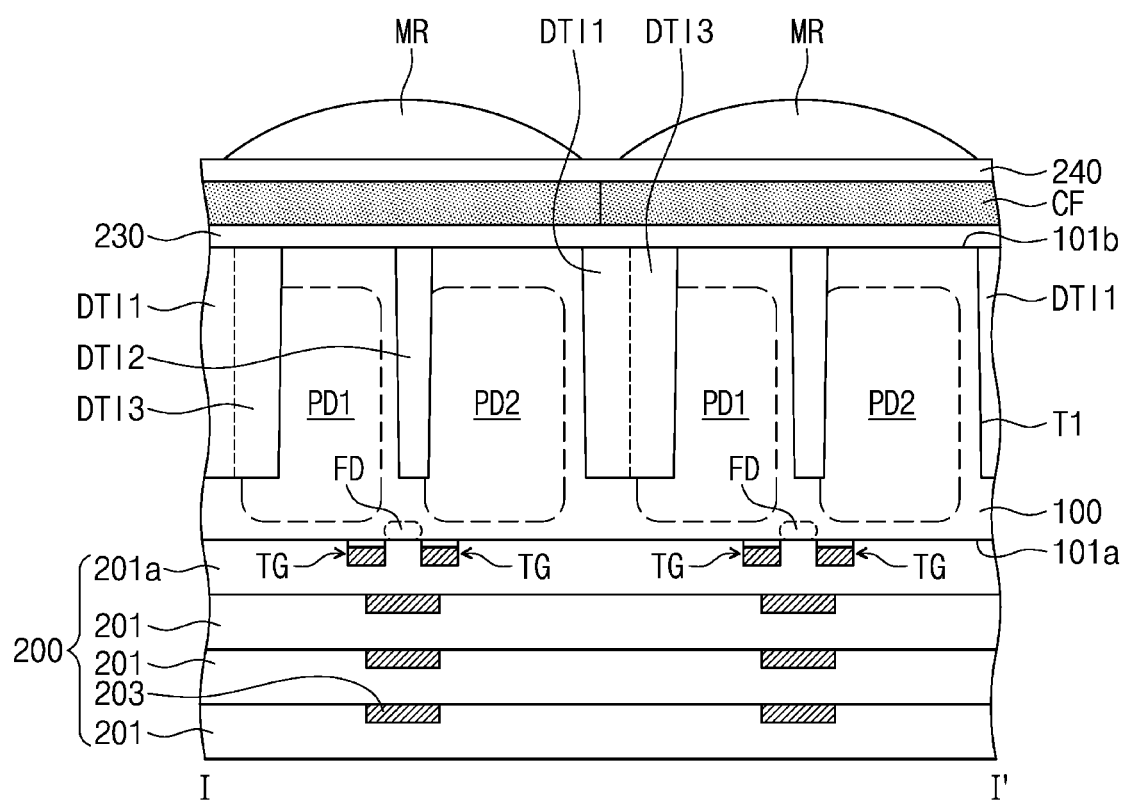
FIG. 12B illustrates a cross-sectional view taken along line I-I' of FIG. 12A, showing an image sensor according to some example embodiments of the present inventive concepts.
Figure 12C:
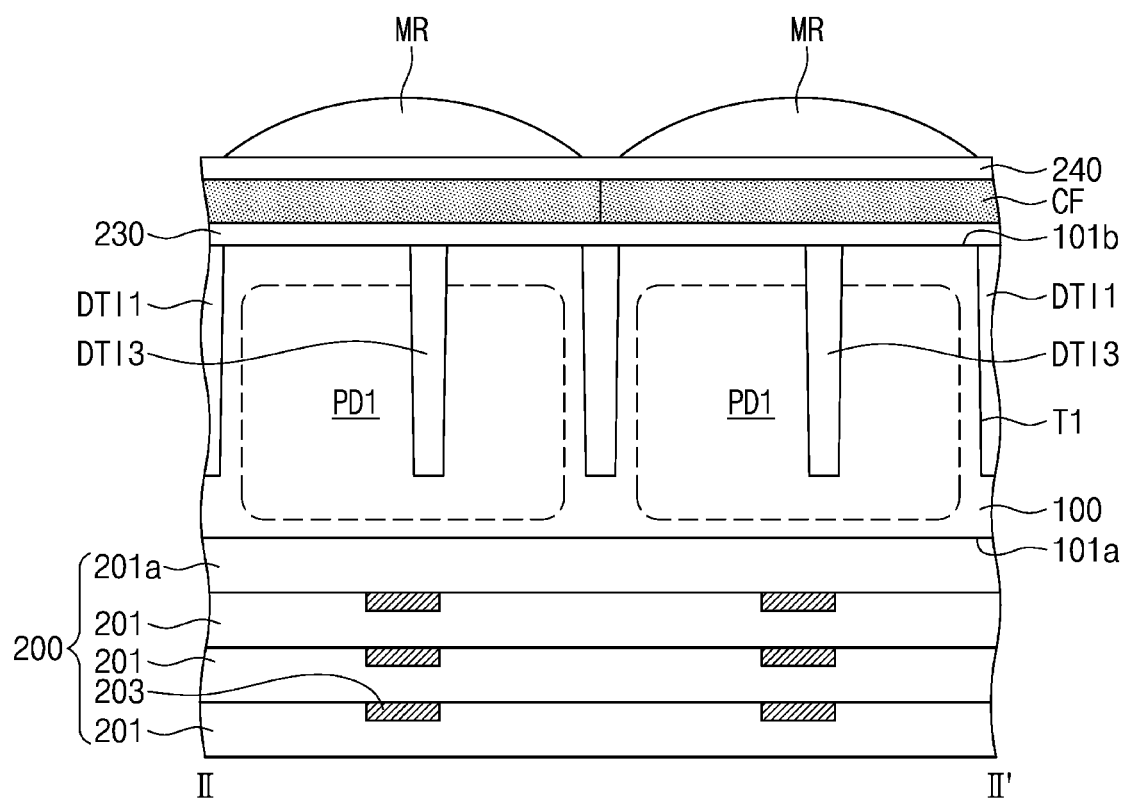
FIG. 12C illustrates a cross-sectional view taken along line II-II' of FIG. 12A, showing an image sensor according to some example embodiments of the present inventive concepts.

FIG. 12A illustrates a plan view showing an image sensor according to some example embodiments of the present inventive concepts. FIG. 12B illustrates a cross-sectional view taken along line I-I' of FIG. 12A, showing an image sensor according to some example embodiments of the present inventive concepts. FIG. 12C illustrates a cross-sectional view taken along line II-II' of FIG. 12A, showing an image sensor according to some example embodiments of the present inventive concepts.

Referring to FIGS. 12A, 12B, and 12C, the second device isolation layer DTI2 may be disposed in the semiconductor layer 100 on each of the pixel regions PX. When viewed in plan, the second device isolation layer DTI2 may be tilted in the third direction Z intersecting the first and second directions X and Y. The second device isolation layer DTI2 may be tilted at a first angle θ1 relative to the central line CR or the first line R1. The second device isolation layer DTI2 may be tilted at a second angle θ2 relative to the second line R2. The first angle θ1 may be greater than 0° and less than 90°. For example, the first angle θ1 may be an acute angle. The second angle θ2 may be greater than 0° and less than 90°. For example, the second angle θ2 may be an acute angle.

A third device isolation layer DTI3 may be disposed in the semiconductor layer 100 on each of the pixel regions PX. When viewed in plan, the third device isolation layer DTI3 may be tilted in the fifth direction Z', or a similar direction thereto, intersecting the second direction Y and the fourth direction X' that is opposite to the first direction X. The fourth direction X' may intersect perpendicularly to the second direction Y. The third device isolation layer DTI3 may be tilted at a third angle θ3 relative to the central line CR or the first line R1. The third angle θ3 may be greater than 0° and less than 90°. For example, the third angle θ3 may be an acute angle. In certain embodiments, the third angle θ3 may be obtained by subtracting the first angle θ1 from 90°. For example, the first angle θ1 may be less than the third angle θ3. The third device isolation layer DTI3 may be tilted at a fourth angle θ4 relative to the second line R2. The fourth angle θ4 may be greater than 0° and less than 90°. For example, the fourth angle θ4 may be an acute angle. In certain embodiments, the fourth angle θ4 may be obtained by subtracting the second angle θ2 from 90°. The second angle θ2 may be greater than the fourth angle θ4. In this sense, when viewed in plan, the third device isolation layer DTI3 may be substantially perpendicular to the second device isolation layer DTI2.

When viewed in plan, the third device isolation layer DTI3 may vertically overlap one or more of the first photoelectric conversion device PD1 and the second photoelectric conversion device PD2. In an example embodiment, when viewed in plan, the third device isolation layer DTI3 may vertically overlap the first photoelectric conversion device PD1 and the second photoelectric conversion device PD2. The third device isolation layer DTI3 may be disposed in one or more of the first photoelectric conversion device PD1 and the second photoelectric conversion device PD2. In an example embodiment, the third device isolation layer DTI3 may be disposed in the first photoelectric conversion device PD1 and the second photoelectric conversion device PD2.

Each of the pixel regions PX may include a first region DPR1, a second region DPR2, a third region DPR3, and a fourth region DPR4 that are separated from each other by the second device isolation layer DTI2 and the third device isolation layer DTI3. The third device isolation layer DTI3 may separate the first region DPR1 and the second region DPR2 from each other in the second direction Y. The third device isolation layer DTI3 may separate the third region DPR3 and the fourth region DPR4 from each other in the second direction Y. The second device isolation layer DTI2 may separate the first region DPR1 and the third region DPR3 from each other in the first direction X, and may separate the second region DPR2 and the fourth region DPR4 from each other in the first direction X.

In certain embodiments, when viewed in plan, the first region DPR1 may have an upper width UW1 greater than a lower width LW1 of the second region DPR2 (UW1>LW1). When viewed in plan, the third region DPR3 may have an upper width UW2 less than a lower width LW2 of the fourth region DPR4 (UW2<LW2).

Figure 13:
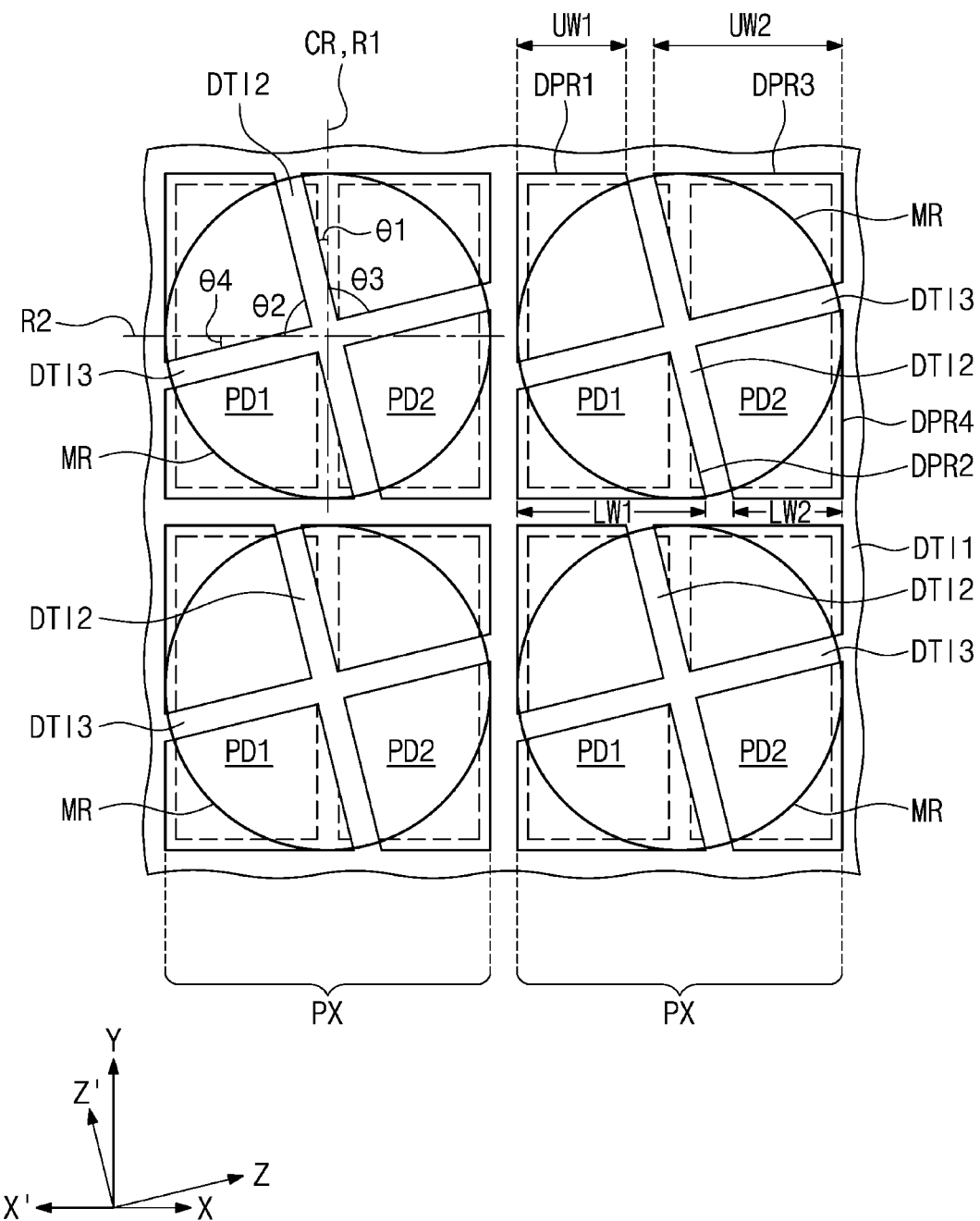
FIG. 13 illustrates a plan view showing an image sensor according to some example embodiments of the present inventive concepts.

FIG. 13 illustrates a plan view showing an image sensor according to some example embodiments of the present inventive concepts.

Referring to FIG. 13, the second device isolation layer DTI2 may be disposed in the semiconductor layer 100 on each of the pixel regions PX. The second device isolation layer DTI2 may be tilted in the fifth direction Z' intersecting the fourth and second directions X' and Y. The second device isolation layer DTI2 may be tilted at a first angle θ1 relative to the central line CR or the first line R1. The second device isolation layer DTI2 may be tilted at a second angle θ2 relative to the second line R2. The first angle θ1 may be greater than 0° and less than 90°. For example, the first angle θ1 may be an acute angle. The second angle θ2 may be greater than 0° and less than 90°. For example, the second angle θ2 may be an acute angle.

A third device isolation layer DTI3 may be disposed in the semiconductor layer 100 on each of the pixel regions PX. The third device isolation layer DTI3 may be tilted in the third direction Z intersecting the first and second directions X and Y. The third device isolation layer DTI3 may be tilted at a third angle θ3 relative to the central line CR or the first line R1. The third angle θ3 may be greater than 0° and less than 90°. For example, the third angle θ3 may be an acute angle. In certain embodiments, the third angle θ3 may be obtained by subtracting the first angle θ1 from 90°. The first angle θ1 may be less than the third angle θ3. The third device isolation layer DTI3 may be tilted at a fourth angle θ4 relative to the second line R2. The fourth angle θ4 may be greater than 0° and less than 90°. For example, the fourth angle θ4 may be an acute angle. In certain embodiments, the fourth angle θ4 may be obtained by subtracting the second angle θ2 from 90°. The second angle θ2 may be greater than the fourth angle θ4. In this sense, when viewed in plan, the third device isolation layer DTI3 may be substantially perpendicular to the second device isolation layer DTI2.

In certain embodiments, when viewed in plan, the first region DPR1 may have an upper width UW1 less than a lower width LW1 of the second region DPR2 (UW1<LW1). When viewed in plan, the third region DPR3 may have an upper width UW2 greater than a lower width LW2 of the fourth region DPR4 (UW2>LW2).

Figure 14:
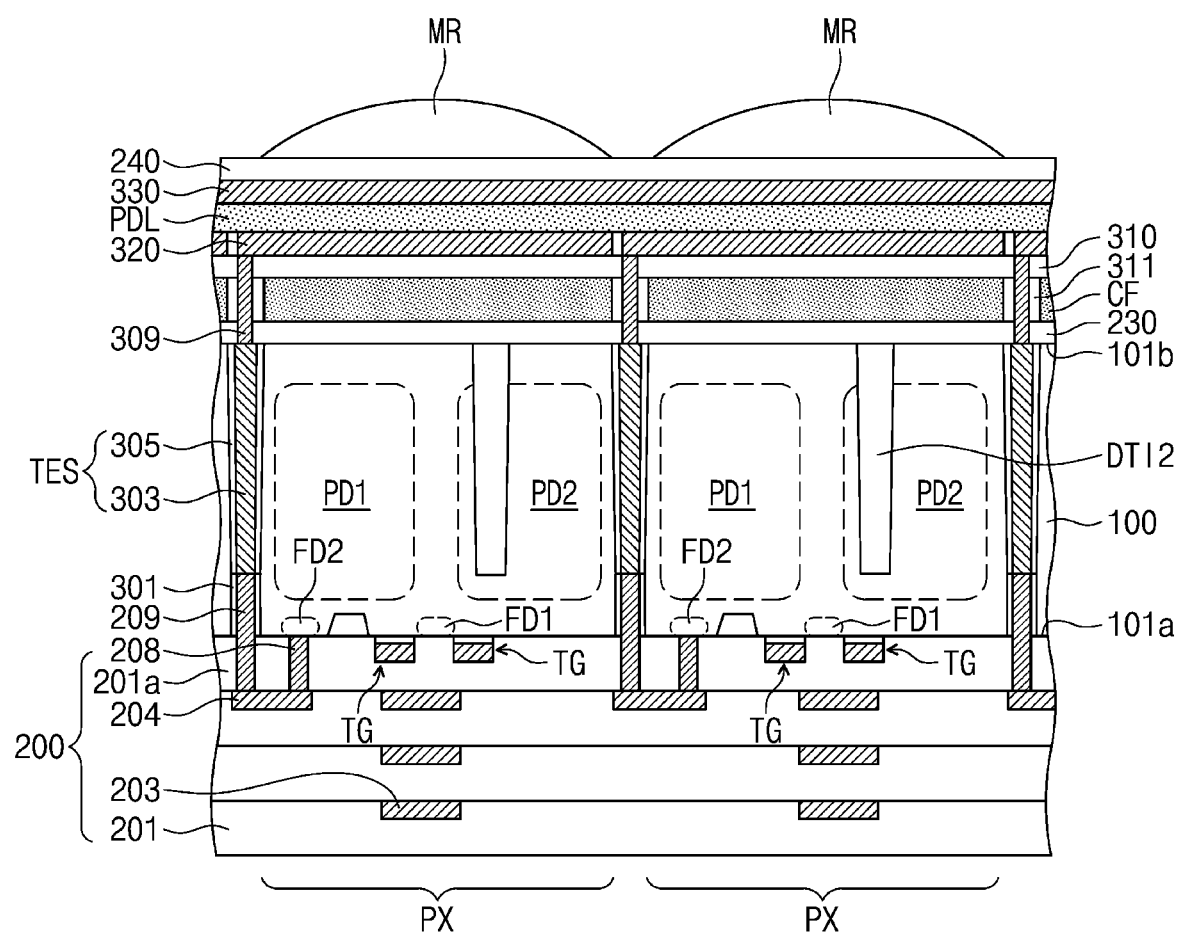
FIG. 14 illustrates a cross-sectional view showing an image sensor according to some example embodiments of the present inventive concepts.

FIG. 14 illustrates a cross-sectional view showing an image sensor according to some example embodiments of the present inventive concepts.

Referring to FIG. 14, a semiconductor layer 100 may be provided therein with a pair of first and second charge detect nodes FD1 and FD2. For example, the pair of first and second charge detect nodes FD1 and FD2 may be disposed in the semiconductor layer 100 on each of pixel regions PX. The first and second charge detect nodes FD1 and FD2 may be disposed adjacent to a first surface 1a of the semiconductor layer 100. The first charge detect node FD1 may be disposed to overlap a second device isolation layer DTI2. The second charge detect node FD2 may be disposed in the semiconductor layer 100 on a side of one of transfer gates TG disposed on one pixel region PX. Through electrode structures TES may each partially penetrate a first device isolation layer DTI1 (see DTI1 of FIG. 2A). The through electrode structures TES may be disposed in the semiconductor layer 100. The through electrode structures TES may be provided to correspond to the pixel regions PX. Each of the through electrode structures TES may include a through electrode 303 and a through dielectric pattern 305. The through dielectric pattern 305 may surround a sidewall of the through electrode 303. The through dielectric pattern 305 may include, for example, one or more of silicon oxide, silicon nitride, and silicon oxynitride. The through electrode 303 may include, for example, n-type doped polysilicon or p-type doped polysilicon.

A buried dielectric pattern 301 may be disposed between each of the through electrode structures TES and the first surface 101a of the semiconductor layer 100. The buried dielectric pattern 301 may have a surface coplanar with the first surface 101a of the semiconductor layer 100. The buried dielectric pattern 301 may include, for example, one or more of a silicon oxide layer, a silicon nitride layer, and a silicon oxynitride layer.

A connection line structure 200 may be disposed on the first surface 101a of the semiconductor layer 100. The connection line structure 200 may include a plurality of interlayer dielectric layers 201 and 201a, wiring lines 203, a connection line 204, a first connection via 208, and a second connection via 209. The first connection via 208 may penetrate a lowermost interlayer dielectric layer 201a and have connection with the second charge detect node FD2. The second connection via 209 may be connected to the through electrode 303 of the through electrode structure TES, while penetrating the lowermost interlayer dielectric layer 201a and the buried dielectric pattern 301. The connection line 204 may be disposed in at least one of the interlayer dielectric layers 201, and may connect the first and second connection vias 208 and 209 to each other. The connection line 204, the first connection via 208, and the second connection via 209 may include one or more of metals (e.g., tungsten, copper, or aluminum) and metal nitrides (e.g., tantalum nitride, titanium nitride, or tungsten nitride).

Contact plugs 309 may be disposed on the through electrode structures TES. The contact plugs 309 may penetrate a first dielectric layer 230 on a second surface 101b of the semiconductor layer 100, dielectric patterns 311 filling spaces between color filters CF, and a second dielectric layer 310 covering top surfaces of the color filters CF and top surfaces of the dielectric patterns 311. The contact plugs 309 may be connected to the through electrode structures TES. The contact plugs 309 may include a metallic material, such as tungsten. The dielectric patterns 311 may include a dielectric material, such as a silicon oxide layer or a silicon nitride layer. The second dielectric layer 310 may include, for example, a silicon oxide layer, a silicon nitride layer, or a silicon oxynitride layer.

Bottom electrodes 320 may be provided on the second dielectric layer 310. The bottom electrodes 320 may be disposed to correspond to first and second photoelectric conversion devices PD1 and PD2. The bottom electrodes 320 may be spaced apart from each other. The contact plugs 309 may correspond to and have electrical connection with the bottom electrodes 320. For example, each of the contact plugs 309 may be connected to a corresponding one of the bottom electrodes 320. The bottom electrodes 320 may include a transparent conductive material. For example, the bottom electrodes 320 may include one or more of ITO (Indium Tin Oxide), IZO (Indium Zinc Oxide), ZnO (Zinc Oxide), and an organic transparent conductive material.

A photoelectric conversion layer PDL may be disposed on the bottom electrodes 320. For example, the photoelectric conversion layer PDL may include an organic photoelectric conversion layer. The organic photoelectric conversion layer may include a p-type organic semiconductor material and an n-type organic semiconductor material, which p-type and n-type semiconductor materials may form a p-n junction. In certain embodiments, the photoelectric conversion layer PDL may include quantum dots or chalcogenide.

A top electrode 330 may be disposed on the photoelectric conversion layer PDL. The top electrode 330 may include a transparent conductive material. For example, the top electrode 330 may include one or more of ITO (Indium Tin Oxide), IZO (Indium Zinc Oxide), ZnO (Zinc Oxide), and an organic transparent conductive material.

A planarization layer 240 and micro-lenses MR may be sequentially stacked on the top electrode 330.

According to some example embodiments of the present inventive concepts, when viewed in plan, because a second device isolation layer is formed tilted between a first photoelectric conversion device and a second photoelectric conversion device, one of the first and second photoelectric conversion devices may receive light incident both in a left-and-right direction and in an upper direction, and the other of the first and second photoelectric conversion devices may receive light incident in a lower direction. Accordingly, the auto-focus sensitivity of an image sensor may increase due to an increase in detection capability for images in horizontal and vertical directions.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. An image sensor, comprising:
a first device isolation layer in a semiconductor layer and defining a plurality of pixel regions;
a first photoelectric conversion device and a second photoelectric conversion device in each of the pixel regions; and
a second device isolation layer in the semiconductor layer and vertically overlapping the first photoelectric conversion device and the second photoelectric conversion device in each of the pixel regions,
wherein the second device isolation layer, when viewed in plan view, is tilted at a first angle with respect to a portion of the semiconductor layer between the first photoelectric conversion device and the second photoelectric conversion device that are spaced apart from each other in a first direction, and
wherein the portion of the semiconductor layer extends in a second direction different from the first direction.

2. The image sensor of claim 1, wherein
the first photoelectric conversion device and the second photoelectric conversion device are spaced apart from each other in the first direction, and
the second device isolation layer, when viewed in plan view, is tilted at the first angle with respect to a first part of the first device isolation layer, the first part extending in the second direction different from the first direction.

3. The image sensor of claim 2,
wherein the second device isolation layer extends in a third direction different from the first and second directions.

4. The image sensor of claim 2,
wherein each of the pixel regions includes a first region and a second region that are separated from each other by the second device isolation layer, and
wherein each of the first and second regions, when viewed in plan, has a trapezoidal shape.

5. The image sensor of claim 1, further comprising a third device isolation layer in the semiconductor layer on each of the pixel regions,
wherein, when viewed in plan view, the third device isolation layer intersects the second device isolation layer and vertically overlaps at least one of the first photoelectric conversion device and the second photoelectric conversion device.

6. The image sensor of claim 5, wherein
the first photoelectric conversion device and the second photoelectric conversion device are spaced apart from each other in the first direction,
the second device isolation layer, when viewed in plan view, is tilted at the first angle with respect to a first part of the first device isolation layer, the first part extending in the second direction different from the first direction, and
the third device isolation layer, when viewed in plan view, is tilted at a second angle with respect to the first part.

7. The image sensor of claim 5, wherein
the first photoelectric conversion device and the second photoelectric conversion device are spaced apart from each other in a first direction,
each of the pixel regions includes a first region, a second region, a third region, and a fourth region that are separated from each other by the second and third device isolation layers,
an upper width of the first region, when viewed in plan view, is greater than a lower width of the second region, and
an upper width of the third region, when viewed in plan view, is less than a lower width of the fourth region.

8. The image sensor of claim 1,
wherein the semiconductor layer includes a first surface and a second surface that face each other,
wherein the image sensor further comprises:
a connection line structure on the first surface of the semiconductor layer;
a color filter on the second surface of the semiconductor layer and vertically overlapping the first and second photoelectric conversion devices; and
a micro-lens on the color filter,
wherein the second device isolation layer is spaced apart from the first surface of the semiconductor layer, and
wherein the color filter and the micro-lens are arranged to have a common center.

9. An image sensor, comprising:
a first device isolation layer in a semiconductor layer and defining a first pixel region and a second pixel region,
the first device isolation layer including
a first isolation segment and a second isolation segment that are spaced apart from each other in a first direction and extend in a second direction different from the first direction,
a third isolation segment that is parallel to the first direction and in contact with a first end of the first isolation segment and a first end of the second isolation segment, and
a fourth isolation segment in contact with a second end of the first isolation segment and a second end of the second isolation segment;
a first photoelectric conversion device and a second photoelectric conversion device that are in the first pixel region; and
a second device isolation layer extending across the first pixel region at a first acute angle with respect to the second direction and contacting the third and fourth isolation segments,
wherein a first distance between the first end of the first isolation segment and a first end of the second device isolation layer is different from a second distance between the second end of the first isolation segment and a second end of the second device isolation layer, and
wherein the first end of the second device isolation layer is in contact with the third isolation segment, and the second end of the second device isolation layer is in contact with the fourth isolation segment.

10. The image sensor of claim 9,
wherein the first distance is greater than the second distance.

11. The image sensor of claim 9,
wherein the first pixel region includes a first region and a second region that are separated from each other by the second device isolation layer, and
wherein each of the first and second regions has a trapezoidal shape.

12. The image sensor of claim 9, wherein
a third distance between the first end of the second device isolation layer and the first end of the second isolation segment is different from the first distance, and
a fourth distance between the second end of the second device isolation layer and the second end of the second isolation segment is different from the second distance.

13. The image sensor of claim 9, further comprising:
a third device isolation layer extending across the second pixel region at a second acute angle, different from the first acute angle, with respect to the second direction.

14. An image sensor comprising:
a plurality of pixel regions in a substrate and defined by a first device isolation layer,
each of the plurality of pixel regions including a first photoelectric conversion device and a second photoelectric conversion device that are spaced from each other in a first direction by a portion of the substrate, the portion of the substrate extending in a second direction different from the first direction; and
a plurality of second device isolation layers, each of the plurality of second device isolation layers being disposed in a corresponding one of the plurality of pixel regions,
wherein the plurality of second device isolation layers include a first type device isolation layer extending at a first acute angle with respect to the portion of the substrate.

15. The image sensor of claim 14,
wherein the first type device isolation layer vertically overlaps the first photoelectric conversion device and the second photoelectric conversion device.

16. The image sensor of claim 14,
wherein the plurality of second device isolation layers further include a second type device isolation layer extending at a second acute angle, different from the first acute angle, with respect to the portion of the substrate.

17. The image sensor of claim 16,
wherein the first acute angle is greater than the second acute angle.

18. The image sensor of claim 14, further comprising:
a plurality of third device isolation layers, each of the plurality of third device isolation layers being disposed in a corresponding one of the plurality of pixel regions and crossing a corresponding one of the plurality of second device isolation layers.

19. The image sensor of claim 18,
wherein at least one of the plurality of third device isolation layers extends at a third acute angle, different from the first acute angle, with respect to the portion of the substrate.

* * * * *